United States Patent
Matsubara et al.

(10) Patent No.: US 8,519,255 B2
(45) Date of Patent: Aug. 27, 2013

(54) THERMOELECTRIC MATERIAL AND METHOD OF MANUFACTURING THE MATERIAL

(75) Inventors: Masato Matsubara, Nagoya (JP); Hirofumi Hazama, Nagoya (JP); Ryoji Asahi, Nishikamo-gun (JP)

(73) Assignee: Kabushiki Kaisha Toyota Chuo Kenkyusho, Aichi (JP)

( * ) Notice: Subject to any disclaimer, the term of this patent is extended or adjusted under 35 U.S.C. 154(b) by 756 days.

(21) Appl. No.: 12/654,111

(22) Filed: Dec. 10, 2009

(65) Prior Publication Data

US 2010/0147352 A1 Jun. 17, 2010

(30) Foreign Application Priority Data

Dec. 15, 2008 (JP) ................. 2008-318873
Jul. 21, 2009 (JP) ................. 2009-170555

(51) Int. Cl.
*H01L 35/14* (2006.01)
*H01L 35/20* (2006.01)

(52) U.S. Cl.
USPC ........................................................ 136/239

(58) Field of Classification Search
USPC ........................................ 136/239; 148/553
See application file for complete search history.

(56) References Cited

FOREIGN PATENT DOCUMENTS

| JP | A-2004-356607 | 12/2004 |
|---|---|---|
| JP | A-005-19713 | 1/2005 |
| JP | A-2005-286228 | 10/2005 |
| JP | A-2006-228912 | 8/2006 |
| JP | A-2006-269731 | 10/2006 |
| JP | A-2007-158191 | 6/2007 |

OTHER PUBLICATIONS

Hohl, Heinrich et al., "Efficient dopants for ZrNiSn-based thermoelectric materials", 1999, J. Phys.: Condens. Matter 11, pp. 1697-1709.*

Asahi, Ryoji et al., "Materials design and development of functional materials for industry", Jan. 24, 2008, J. Phys,: Condens, Matter 20, pp. 1-7.*

Muta, Hiroaki et al., "Substitution Effect on Thermoelectric Properties of ZrNiSn Based Half-Heusler Compounds", 2006, Materials Transactions, The Thermoelectrics Society of Japan, vol. 47, No. 6, pp. 1453-1457.*

Shen, Qiang et al., "Thermoelectric properties of ZrNiSn-based half-Heusler compounds by solid state reaction method", 2001, Journal of Materials Science Letters 20, pp. 2197-2199.*

Kafer et al.; "Growth and thermoelectric properties of the intermetallic compounds MNiSn (M=Ti, Zr, Hf);" *Inst. Phys. Conf. Ser.*; 1998; pp. 185-189; Section A, No. 152.

(Continued)

*Primary Examiner* — Jonathan Johnson
*Assistant Examiner* — Tamir Ayad
(74) *Attorney, Agent, or Firm* — Oliff & Berridge, PLC

(57) ABSTRACT

The present invention provides a thermoelectric material and a method of manufacturing it. The thermoelectric material contains a half-Heusler compound including a composition represented by: $(Ti_{1-a}A_a)_{1+x}(Ni_{1-b}B_b)_{1+y}(Sn_{1-c}C_c)$ where $0 \leq a < 0.1$, $0 \leq b < 0.1$ and $0 \leq c < 0.1$; $-0.1 \leq x \leq 0.2$ and $0 < y \leq 0.2$; A is one or more elements selected from the group consisting of group IIIa elements, group IVa elements (excluding Ti), group Va elements and rare earth elements; B is one or more elements selected from the group consisting of group VIIIa elements (excluding Ni) and group Ib elements; and C is one or more elements selected from the group consisting of group IIIb elements, group IVb elements (excluding Sn) and group Vb elements, wherein amounts of Zr substitution and Hf substitution at Ti sites of the half-Heusler compound are less than 1 at %, respectively.

17 Claims, 13 Drawing Sheets

(56) References Cited

OTHER PUBLICATIONS

Bhattacharya et al.; "Effect of boundary scattering on the thermal conductivity TiNiSn-based half-Heusler alloys;" *Physical Review*; 2008; pp. 84203-1-84203-7; vol. B, No. 77.

Kim et al.; "Enhancement of high temperature thermoelectric properties of intermetallic compounds based on a Skutterudite $IrSb_3$ and a half-Heusler TiNiSb;" *Science and Technology of Advanced Materials*; (2004); pp. 485-489; vol. 5.

Morimura et al.; "TEM observation of coexistent Heusler and half-Huesler phases in $TiNi_{1.5}Sn$;" *Journal of Alloys and compounds*; 2006; pp. 155-159; No. 416.

Shen et al.; "Effects of partial substitution of Ni by Pd on the thermoelectric properties of ZrNiSn-based half-Heusler compounds;" *Applied Physics Letters*; Dec. 17, 2001; pp. 4165-4167; vol. 79, No. 25.

Culp et al; "Complex MNiSn Phases as Stable High-Temperature Thermoelectric Materials;" *2005 International Conference on Thermoelectrics*; 2005; pp. 384-387.

\* cited by examiner (a)

(b)

(c)

(d)

(e)

THERMOELECTRIC MATERIAL AND METHOD OF MANUFACTURING THE MATERIAL

BACKGROUND OF THE INVENTION

1. Field of the Invention

The present invention relates to a thermoelectric material and a method of manufacturing the material, and more specifically, to a thermoelectric material containing a half-Heusler compound as a major component, and a method of manufacturing the material.

2. Description of the Related Art

Thermoelectric conversion refers to direct conversion of electric energies into thermal energies for cooling or heating with the use of the Seebeck effect or the Peltier effect, and vice versa. The thermoelectric conversion has the following characteristics:

(1) Extra waste materials are not discharged during the energy conversion;
(2) Exhaust heat can be effectively used;
(3) Electric power generation can be continued until constituent materials are deteriorated; and
(4) A movable device such as a motor or turbine is not necessary, and hence maintenance is not needed. Therefore, the thermoelectric conversion attracts attention as a technique for highly-efficient utilization of energy.

As an index for evaluating the property of a material that can convert thermal energies and electric energies into one another, that is, a thermoelectric material, a figure of merit Z ($=S^2\sigma/\kappa$, where S, $\sigma$ and $\kappa$ are Seebeck coefficient, electric conductivity and thermal conductivity, respectively), or a dimensionless figure of merit ZT given as a product of the figure of merit Z by the absolute temperature T at which the figure of merit Z is indicated, is generally used. Alternatively, as an index for evaluating the property of a thermoelectric material, a power factor PF ($=S^2\sigma$) is sometimes used.

The Seebeck coefficient represents the magnitude of an electromotive force generated by a temperature difference of 1K. Thermoelectric materials respectively have the Seebeck coefficients inherent thereto, and are roughly divided into two groups, one of which has positive Seebeck coefficients (p-type) and the other of which has negative Seebeck coefficients (n-type).

Thermoelectric materials are typically used in a state where a p-type thermoelectric material and an n-type thermoelectric material are joined together. Such a joint pair is generally called a "thermoelectric device". The figure of merit of a thermoelectric device is dependent on the figure of merit $Z_p$ of a p-type thermoelectric material, the figure of merit $Z_n$ of an n-type thermoelectric material and the shape of the p-type and the n-type thermoelectric materials. It is known that, when the shape thereof is optimized, the figure of merit of the thermoelectric device becomes larger as $Z_p$ and/or $Z_n$ are larger. Accordingly, in order to obtain a thermoelectric device having a high figure of merit, it is important that thermoelectric materials having high figures of merit $Z_p$ and $Z_n$ are used.

As such thermoelectric materials, the followings are known:

(1) Compound semiconductors such as Bi—Te, Pb—Te and Si—Ge based alloys;
(2) Skutterudite compounds such as Zn—Sb, Co—Sb and Fe—Sb based alloys; and
(3) Half-Heusler compounds such as TiNiSn.

Among them, the Bi—Te and Pb—Te based compound semiconductors exhibit high ZT in the low temperature range; however, there is a problem in that the semiconductors cannot be used in the intermediate to high temperature range, and that the semiconductors contain large amounts of elements having large environmental burdens, such as Pb, Te and Sb. Further, the Ge—Si based compound semiconductors contain large amounts of expensive Ge.

The skutterudite compounds are p-type thermoelectric materials exhibiting relatively high thermoelectric properties in the low to intermediate temperature range. It is known that certain skutterudite compounds have ZT greater than 1 at 527° C. (800 K). For example, because the temperature of automotive exhaust gas is approximately 800 K, it is expected that, when a thermoelectric device using such skutterudite compounds is employed, an exhaust heat recovery system with high-efficiency could be obtained. However, there is a problem in that many of the skutterudite compounds exhibiting high thermoelectric properties in the low to intermediate temperature range contain large amounts of elements having large environmental burdens such as Sb.

Contrary to this, the TiNiSn or ZrNiSn based half-Heusler compounds have characteristics that the compounds exhibit high thermoelectric properties in the low to intermediate temperature range and that the compounds do not contain any element having environmental burdens. Herein, "half-Heusler compounds" mean a series of compounds having the structure in which half the atoms at Cu sites of Heusler alloy $Cu_2AlMn$ are deficient. Although both the TiNiSn compounds and the ZrNiSn compounds essentially have high power factors, there is a problem in that those compounds have limits in reachable figures of merit due to their high thermal conductivities.

In order to solve the aforementioned problem, various proposals have been conventionally made. For example, Patent Document 1 discloses a thermoelectric material having a composition represented by $(Ti_{0.98}Zr_{0.01}Hf_{0.01})NiSn$.

In the document, the following descriptions are made:

(1) When all of Ti, Zr and Hf are contained in the A sites of MNiSn, which is a type of the half-Heusler compounds represented by the general formula ABX, the thermal conductivity thereof can be reduced;
(2) Lattice thermal conductivity of the material having the composition of $(Ti_{0.98}Zr_{0.01}Hf_{0.01})NiSn$ at 300 K is 3.71 W/mK, and the dimensionless figure of merit thereof at 300 K, is 0.05; and
(3) The lattice thermal conductivity of TiNiSn at 300 K is 9.75 W/mK.

Patent Document 2 discloses a thermoelectric material having the composition represented by $(Ti_{0.25}Zr_{0.45}Hf_{0.30})_{33}Ni_{34}(Sn_{0.996}Sb_{0.004})_{33}$, in which an existence ratio of Ti—X (where X is at least one selected from Sn and Sb) phase is 8.5%.

In the document, the following descriptions are made:

(1) When the base alloy is treated at 1200° C., the existence ratio of Ti—X phase is decreased and the thermoelectric property thereof is improved; and
(2) When part of Ti is substituted with Zr or Hf, the thermal conductivity can be reduced.

Patent Documents 3 and 4 disclose a thermoelectric material having the composition represented by $(Ti_{0.3}Zr_{0.35}Hf_{0.35})NiSn$.

In the documents, the following description is made: when two or more elements selected from the group consisting of Ti, Zr and Hf are used at M sites of the half-Heusler compounds represented by the general formula $M\alpha\beta$, the thermal conductivity can be greatly reduced.

Non-patent Document 1 discloses a TiNiSn single crystal synthesized by the Sn-flux method. In the document, the following description is made: the dimensionless figure of merit ZT of the TiNiSn single crystal at 300 K is 0.09. Further, Patent Document 5 discloses a TiNiSn single crystal synthesized by the unidirectional solidification method.

Patent Document 6 discloses a thermoelectric material having the composition represented by $Ti_{0.95}Hf_{0.05}NiSn_{0.99}Sb_{0.01}$.

In the document, the following description is made: the power factor of $Ti_{0.95}Hf_{0.05}NiSn_{0.99}Sb_{0.01}$ at 700 K is 4.1 mW/mK$^2$, whereas that of TiNiSn at 700 K is 1.8 mW/mK$^2$.

In Non-patent Documents 2 and 3, the following description is made: the thermal conductivity of TiNiSn at room temperature is 7 to 8 W/mK.

Non-patent Document 4 discloses $TiNi_{1.5}Sn$ obtained by melting a raw material in a high-frequency induction melting furnace to be cast, and then by remelting the resultant ingot to be rapidly solidified. In the document, the following description is made: a mixed phase including the half-Heusler phase and the full-Heusler phase can be obtained by such a method.

Further, in Non-patent Document 5, the following description is made: reduction in the thermal conductivity of ZrNiSn can be realized by substituting some of the Ni sites thereof with Pd. Further, Non-patent Document 6 reports an effect of reducing the thermal conductivity by substituting part of the Ni sites with Pt.

[Patent Document 1] Japanese Patent Application Publication No. 2004-356607
[Patent Document 2] Japanese Patent Application Publication No. 2006-269731
[Patent Document 3] Japanese Patent Application Publication No. 2005-286228
[Patent Document 4] Japanese Patent Application Publication No. 2007-158191
[Patent Document 5] Japanese Patent Application Publication No. 2006-228912
[Patent Document 6] Japanese Patent Application Publication No. 2005-019713
[Non-patent Document 1] W. Kafer et al., Inst. Phys. Conf. Ser. No. 152, 185(1997)
[Non-patent Document 2] S. Bhattacharya et al., Phys. Rev. B77, 184203(2008)
[Non-patent Document 3] S. W. Kim et al., Sci. and Tech. of Adv. Matter. 5, 485(2004)
[Non-patent Document 4] T. Morimura et al., J. Alloys and Compounds 416, 155(2006)
[Non-patent Document 5] Q. Shen et al., Appl. Phys Letter 79 (2001) 4165-4167
[Non-patent Document 6] S. Culp et al., Proceeding of ICT 2005

The TiNiSn based compound has a relatively high power factor PF; however, there is a problem in that the thermal conductivity κ is high. On the other hand, the method of substituting some of the Ti sites of the TiNiSn based compound with a heavy element such as Zr and Hf, is effective as a way to reduce the thermal conductivity κ of the TiNiSn based compound. However, heavy elements such as Zr and Hf (in particular, Hf) are expensive in comparison with Ti, causing a problem in terms of cost.

Further, when synthesizing the TiNiSn based compound, a secondary phase such as the full-Heusler phase or $Ti_6Sn_5$ is sometimes generated depending on the composition and the manufacturing conditions. If the secondary phase is a metallic phase, precipitation of the secondary phase may cause the thermoelectric property thereof to be deteriorated.

The same is true with the ZrNiSn based compound.

SUMMARY OF THE INVENTION

An object of the present invention is to provide a thermoelectric material with which the thermal conductivity of the TiNiSn based compound or ZrNiSn based compound can be reduced without the use of an expensive heavy element such as Zr or Hf (in particular, Hf), thereby allowing the dimensionless figure of merit to be improved, and provide a method of manufacturing the material.

Another object of the present invention is to provide a thermoelectric material in which a secondary phase, which may cause the thermoelectric property to be deteriorated, is contained in a small amount, and provide a method of manufacturing the material.

In order to achieve the aforementioned objects, the first gist of the thermoelectric material according to the present invention is to contain a half-Heusler compound including a composition represented by the following formula (1):

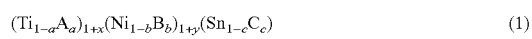

(1)

where $0 \leq a < 0.1$, $0 \leq b < 0.1$ and $0 \leq c < 0.1$;
$-0.1 \leq x \leq 0.2$ and $0 < y \leq 0.2$;

A is one or more elements selected from the group consisting of group IIIa elements, group IVa elements (excluding Ti), group Va elements and rare earth elements;

B is one or more elements selected from the group consisting of group VIIIa elements (excluding Ni) and group Ib elements; and C is one or more elements selected from the group consisting of group IIIb elements, group IVb elements (excluding Sn) and group Vb elements, wherein amounts of Zr substitution and Hf substitution at Ti sites of the half-Heusler compound are less than 1 at %, respectively.

In the formula (1), y preferably satisfies $0.015 \leq y \leq 0.145$. Further, a ratio of the maximum peak intensity $(I_{FULL(220)} \times 100/I_{HALF(220)})$ is preferably less than 18%, where $I_{HALF(220)}$ is the maximum peak intensity in X-ray diffraction of the half-Heusler phase, and $I_{FULL(220)}$ is the maximum peak intensity in X-ray diffraction of the full-Heusler phase.

The second gist of the thermoelectric material according to the present invention is to contain a half-Heusler compound including a composition represented by the following formula (2):

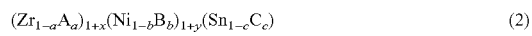

(2)

where $0 \leq a < 0.1$, $0 \leq b < 0.1$ and $0 \leq c < 0.1$;
$-0.1 \leq x \leq 0.2$ and $0 < y \leq 0.2$;

A is one or more elements selected from the group consisting of group IIIa elements, group IVa elements (excluding Zr), group Va elements and rare earth elements;

B is one or more elements selected from the group consisting of group VIIIa elements (excluding Ni) and group Ib elements; and C is one or more elements selected from the group consisting of group IIIb elements, group IVb elements (excluding Sn) and group Vb elements, wherein an amount of Hf substitution at Zr sites of the half-Heusler compound is less than 1 at %.

A method of manufacturing a thermoelectric material according to the present invention includes a rapid cooling step in which a molten metal obtained by melting a raw material weighed so as to become the half-Heusler compound according to the present invention, or obtained by remelting an ingot produced by melting a raw material weighed so as to become the half-Heusler compound and then by casting the molten metal, is rapidly solidified.

In the TiNiSn half-Heusler compound or the ZrNiSn half-Heusler compound, when the ratio of Ni site atoms to Sn site atoms (=1+y) is larger than 1 (y>0), the excessive Ni site atoms are introduced into interstitial sites (4d site). Accordingly, the thermal conductivity κ can be reduced without the use of a large amount of an expensive element such as Zr or Hf (in particular, Hf).

Further, when an appropriate dopant is added to the Ti sites (or Zr sites), Ni sites and/or Sn sites in addition to the introduction of the excessive Ni site atoms into the interstitial sites, the power factor PF can be further increased while maintaining the thermal conductivity κ at a low level.

Further, when the composition and the manufacturing conditions are optimized such that the ratio of the maximum peak intensity of the full-Heusler phase to the half-Heusler phase is less than a predetermined value, the decrease in the thermoelectric property due to the precipitation of the full-Heusler phase can be suppressed.

DETAILED DESCRIPTION OF THE INVENTION

Hereinafter, an embodiment of the present invention will be described in detail.

[1. Thermoelectric Material (1)]

A thermoelectric material according to a first embodiment of the present invention contains a half-Heusler compound having a predetermined composition.

[1.1. Crystal Structure]

Figure 1:
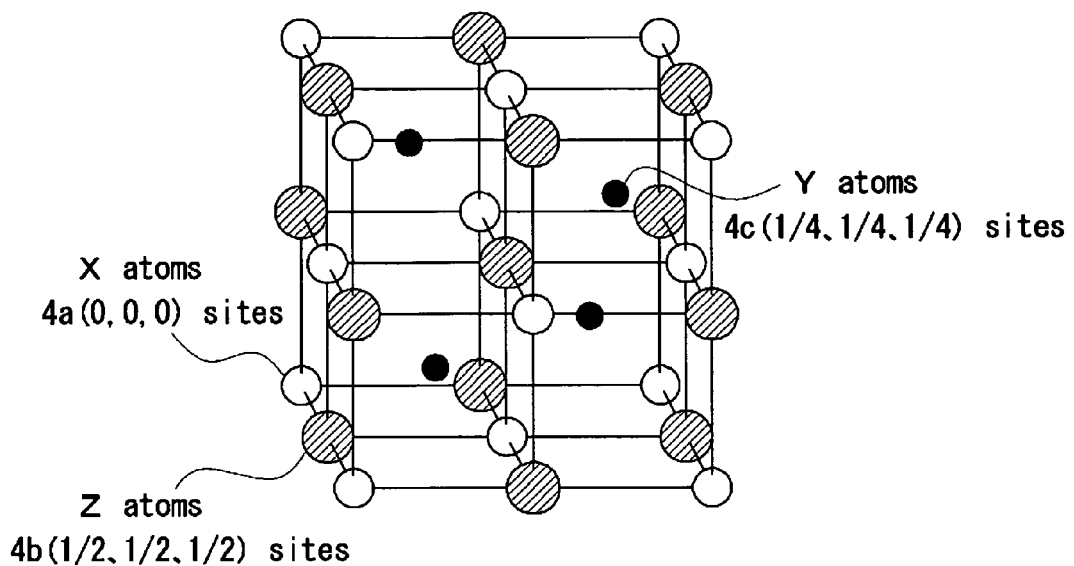
FIG. 1 is a view illustrating a unit cell of an AgAsMg-type crystal structure.

FIG. 1 illustrates a schematic view of a unit cell of an AgAsMg-type crystal structure. The half-Heusler compound has the AgAsMg-type crystal structure (space group F43m), and is represented by the general formula: XYZ. A TiNiSn based compound of which the major phase of a thermoelectric material according to the present embodiment is composed, is one of the half-Heusler compounds having the AgAsMg-type crystal structure.

In FIG. 1, the X atoms and Z atoms are respectively located at 4a (0, 0, 0) sites (hereinafter, simply referred to as "Ti sites" or "Zr sites") and 4b (1/2, 1/2, 1/2) sites (hereinafter, simply referred to as "Sn sites"). The X atoms and Z atoms form a rock salt structure. The Ti sites and the Sn sites are equivalent to each other.

The Y atoms are located at one of the two diagonal positions (body-center of a cube structured by the X atoms and Z atoms), i.e., 4c (1/4, 1/4, 1/4) sites (hereinafter, simply referred to as "Ni sites"). The other diagonal position, i.e., 4d (3/4, 3/4, 3/4) sites (hereinafter, simply referred to as "4d sites") is usually empty.

As stated later, when the Ni site atoms are in excess relative to the Sn site atoms, the excessive Ni site atoms are introduced into the 4d sites.

[1.2. Number of Valence Electrons]

The number of valence electrons in an atom of the half-Heusler compound: XYZ containing no dopant is 6. It is known that the half-Heusler compound, the number of valence electrons in an atom of which is 6 (or, the total number of valence electrons is 18), exhibits semiconducting characteristics, and has a Seebeck coefficient S and an electric resistivity ρ, which are of appropriate magnitudes.

Because the half-Heusler compound: XYZ is a compound in which X:Y:Z=1:1:1, the number of valence electrons in an atom #e is represented by the following equation (a):

$$\#e = (\#e_X + \#e_Y + \#e_Z)/3 \tag{a}$$

where $\#e_X$, $\#e_Y$ and $\#e_Z$ are the numbers of valence electrons of the X atom, Y atom and Z atom, respectively. When each site is occupied by multiple types of atoms, $\#e_X$, $\#e_Y$, and $\#e_Z$ are the average numbers of valence electrons of the atoms occupying each site, respectively.

In the present invention, "number of valence electrons" means the number of electrons contributing to a chemical bonding. The following Table 1 shows the number of valence electrons of each atom.

TABLE 1

| | Group | | | | | | |
|---|---|---|---|---|---|---|---|
| | Ia | IIa | IIIa and lanthanoid element | IVa | Va | VIa | VIIa |
| Number of valence electrons | 1 | 2 | 3 | 4 | 5 | 6 | 7 |
| | | Group VIIIa | | | | | |
| | | (Fe,Ru,Os) | | (Co,Rh,Ir) | | (Ni,Pd,Pt) | |
| Number of valence electrons | | 8 | | 9 | | 10 | |
| Group | Ib | IIb | IIIb | IVb | Vb | VIb | VIIb |
| Number of valence electrons | 1(11) | 2(12) | 3 | 4 | 5 | 4 | 5 |

Phonon scattering is increased when, at any one or more sites of the half-Heusler compound XYZ having the number of valence electrons in an atom of 6, a homologous element having the same number of valence electrons as that of the half-Heusler compound is doped. As a result, the thermal conductivity κ is reduced.

On the other hand, the number of valence electrons in an atom is varied when, at any one or more sites of the half-Heusler compound XYZ having the number of valence electrons in an atom of 6, an element having the different number of valence electrons is doped. As a result, the electrical conductivity σ is increased, the absolute value of the Seebeck coefficient S is decreased, or the thermal conductivity κ is decreased.

The doping may substitute the constituent elements at only one site, or may simultaneously substitute those at two or more sites. Alternatively, at each of one or more sites, the doping may substitute some of the constituent elements with two or more types of elements, the numbers of valence electrons of which may be the same as or different from that of the constituent elements.

In many cases, the half-Heusler compounds generally become n-type thermoelectric materials because their electrons serve as dominant carriers even when the number of valence electrons in an atom is 6. When some of the constituent elements of such a half-Heusler compound are substituted with an element having the number of valence electrons larger than that of such constituent elements (hereinafter, this elements is referred to as an "n-type dopant"), the half-Heusler compound, the number of valence electrons of which in an atom is larger than 6, can be obtained. When the number of valence electrons in an atom exceeds 6, an electron is doped, allowing an n-type thermoelectric material having a larger electrical conductivity to be obtained.

On the other hand, when some of the constituent elements of the half-Heusler compound, the number of valence electrons of which in an atom is 6, are substituted with an element having the number of valence electrons smaller than that of such constituent elements (hereinafter, this elements is referred to as a "p-type dopant"), the half-Heusler compound, the number of valence electrons of which in an atom is smaller than 6, can be obtained. When the number of valence electrons in an atom is smaller than 6, a hole is doped. Further, when an amount of the p-type dopant exceeds a certain constant amount, the Seebeck coefficient S is turned to positive, allowing a p-type thermoelectric material to be obtained.

Further, the doping may be performed in a way that an n-type dopant and a p-type dopant are simultaneously added. That is, an element having the number of valence electrons larger than that of the major constituent element, and an element having the number of valence electrons smaller than that thereof, may be simultaneously added at the sites which are the same as or different from each other. Alternatively, even when some atoms occupying at least two sites are respectively substituted with atoms having the numbers of valence electrons different from that of the atoms at the site so as to maintain the number of valence electrons in an atom at 6, the thermoelectric property thereof can be improved. It is thought that this can be brought by the following reasons:

(1) The thermal conductivity κ is reduced by the element substitution;
(2) The Seebeck coefficient S is increased by a change of the electronic structure, e.g. the change causing the inclination of the density of the state near the Fermi level to the energy to be steep; or
(3) Because the p-type dopant and the n-type dopant form a local dipole such that a Coulomb's force due to the dopants is shielded, allowing decrease in the carrier mobility to be suppressed.

However, the increase in the carriers is mainly dependent on a difference between the increase in the number of valence electrons given by the n-type dopant and the increase in that given by the p-type dopant. Therefore, the simultaneous addition of the n-type dopant and the p-type dopant is not beneficial in terms of the increase in the carriers, and therefore it is preferable that one of the two is added.

The doping into the half-Heusler compound is preferably performed such that the number of valence electrons in an atom after the doping is 5.9 to 6.1 (inclusive). If the number of valence electrons in an atom is smaller than 5.9 or larger than 6.1, the half-Heusler compound becomes a metallic phase in either case, failing to obtain a high thermoelectric property.

In general, the Seebeck coefficient S, the electrical conductivity σ and the thermal conductivity κ, which control thermoelectric property, are all functions of the career concentration. Accordingly, in order to obtain a high thermoelectric property, the number of valence electrons in an atom is preferably selected so as to have an optimal value in accordance with the composition of the half-Heusler compound.

[1.3. Constituent Elements]

In the present embodiment, the half-Heusler compound (hereinafter, referred to as "TiNiSn half-Heusler compound") has a composition represented by the following equation (1):

$$(Ti_{1-a}A_a)_{1+x}(Ni_{1-b}B_b)_{1+y}(Sr_{1-c}C_c) \tag{1}$$

where $0 \leq a < 0.1$, $0 \leq b < 0.1$ and $0 \leq c < 0.1$;

$-0.1 \leq x \leq 0.2$, $0 < y \leq 0.2$;

A is one or more elements selected from the group consisting of group IIIa elements, group IVa elements (excluding Ti), group Va elements and rare earth elements;

B is one or more elements selected from the group consisting of group VIIIa elements (excluding Ni) and group Ib elements; and C is one or more elements selected from the group consisting of group IIIb elements, group IVb elements (excluding Sn) and group Vb elements, wherein amounts of Zr substitution and Hf substitution at the Ti sites of the TiNiSn half-Heusler compound are less than 1 at %, respectively.

"A" means an element (dopant) substituting the Ti sites. The element A may be any one of group IIIa elements ($_{21}$Sc, $_{39}$Y), group IVa elements excluding Ti ($_{72}$Zr, $_{72}$Hf), group Va elements ($_{23}$V, $_{41}$Nb, $_{73}$Ta), or rare earth elements ($_{57}$La to $_{71}$Lu).

"B" means an element (dopant) substituting the Ni sites. The element B may be any one of group VIIIa elements excluding Ni ($_{26}$Fe, $_{27}$Co, $_{44}$Ru, $_{45}$Rh, $_{46}$Pd, $_{76}$Os, $_{77}$Ir, $_{78}$Pt), or group Ib elements ($_{29}$Cu, $_{47}$Ag, $_{79}$Au).

"C" means an element (dopant) substituting the Sn sites. The elements C may be any one of group IIIb elements ($_{5}$B, $_{13}$Al, $_{31}$Ga, $_{49}$In, $_{81}$Tl), group IVb elements excluding Sn ($_{6}$C, $_{14}$Si, $_{32}$Ge, $_{82}$Pb), or group Vb elements ($_{7}$N, $_{15}$P, $_{33}$As, $_{51}$Sb, $_{83}$Bi).

Among them, the element A is preferably $_{39}$Y. The element B is preferably any one or more selected from $_{27}$Co and $_{29}$Cu. The element C is preferably any one or more selected from the group consisting of $_{13}$Al, $_{14}$Si and $_{51}$Sb.

These elements are relatively inexpensive and have significant effects of increasing the power factor PF without a great increase in the thermal conductivity κ, and therefore are suitable as elements substituting each site.

"a" represents an amount of substitution of the Ti sites by the element A. "b" represents an amount of substitution of the Ni sites by the element B. "c" represents an amount of substitution of the Sn sites by the element C.

If each site is substituted with elements, the numbers of valence electrons of which are the same as or different from that of the elements at the site, the carrier concentration is increased, or the phonon scattering is increased. However, when the amount of substitution of each site is in excess, the generation rate of a secondary phase is increased, and hence thermoelectric property is contrarily decreased. Accordingly, a, b and c are needed to be less than 0.1, respectively. More preferably, a, b and c are 0.05 or less, respectively.

When $\overline{Zr}$ or Hf is used as the element A, the amounts of substitution by the two are limited to less than 0.01 (1 at %), respectively.

"x" represents a shift of the elements (Ti+A) occupying the Ti sites from the stoichiometric composition. Even when the amount of the (Ti+A) is shifted from the stoichiometric composition, the lattice defect and the thermoelectric property of the half-Heusler phase are not affected so much. However, when the amount of (Ti+A) is too small in comparison with the stoichiometric composition, there is a problem in that secondary phases such as the TiNi$_2$Sn full-Heusler compound, Sn, Ni and Ni—Sn alloy are precipitated. Accordingly, x is needed to be −0.1 or more. x is preferably −0.05 or more, more preferably −0.01 or more.

On the other hand, when the amount of (Ti+A) is in excess in comparison with the stoichiometric composition, the secondary phases having the excessive Ti as their major components (for example, metallic Ti phase, Ti$_6$Sn$_5$, etc.) are precipitated in the material. Accordingly, x is needed to be 0.2 or less. x is preferably 0.15 or less, more preferably 0.1 or less.

"y" represents a shift of the elements (Ni+B) occupying the Ni sites from the stoichiometric composition. When an amount of the (Ni+B) is in excess relative to the elements (Sn+C) occupying the Sn sites, the excessive (Ni+B) are introduced into 4d sites. The (Ni+B) introduced into the 4d sites have functions of reducing the thermal conductivity κ of the half-Heusler phase without decreasing the power factor PF. Accordingly, y is needed to be larger than 0. y is preferably 0.015 or more, more preferably 0.047 or more.

On the other hand, when the amount of the (Ni+B) is in excess in comparison with the stoichiometric composition, the full-Heusler phase is precipitated in the material. Because the full-Heusler phase is a metallic phase, the precipitation of the full-Heusler phase causes the thermoelectric property to be deteriorated. Accordingly, y is needed to be 0.2 or less. y is preferably 0.145 or less, more preferably 0.123 or less.

Among the half-Heusler compounds represented by equation (1), the half-Heusler compound satisfying $0.015 \leq y \leq 0.145$ is preferred.

[1.4 Lattice Constant of TiNiSn Half-Heusler Compound]

When the amount of the (Ni+B) is in excess in comparison with the stoichiometric composition, and the manufacturing conditions are optimized, the excessive (Ni+B) are introduced into the 4d sites. As a result, the lattice constant of the TiNiSn half-Heusler compound is increased. That is, the increase in the lattice constant is correlated with the amount of the (Ni+B) introduced into the 4d sites.

In order to reduce the thermal conductivity κ without the decrease in the power factor PF, the lattice constant of the TiNiSn half-Heusler compound (major phase) is preferably 0.5933 nm or more, more preferably 0.5937 nm or more.

For example, in the case of a Ti—Ni—Sn sintered body containing no dopant, the lattice constant of the half-Heusler phase can be varied by controlling the Ni/Sn ratio. Specifically, by varying the y value, the TiNiSn half-Heusler compound, the lattice constant of which is 0.5929 nm to 0.5942 nm (inclusive), can be obtained.

On the other hand, in the material on which the Y—Sb substitution is performed to improve the power factor PF, a material whose lattice constant is 0.5947 nm can be synthesized. Accordingly, the upper limit of the lattice constant of the TiNiSn half-Heusler compound having a high power factor PF is determined as 0.5947 nm.

[1.5. Impurities]

Although the thermoelectric material according to the present invention is preferably made of only the aforementioned TiNiSn half-Heusler compound, inevitable impurities (secondary phase) may be contained. However, the secondary phase adversely affecting the thermoelectric property is preferably contained in small amounts.

Further, the thermoelectric material according to the present embodiment may be a complex of the aforementioned TiNiSn half-Heusler compound and other materials (for example, resin and rubber, etc.).

Herein, "secondary phase" means phases different from that of the TiNiSn half-Heusler compound. Among them, the secondary phase having a high electrical conductivity σ causes the electrical conductivity σ of the whole system to be elevated. The electrical conductivity σ and the thermal conductivity κ generally have a positive correlation with each other, and hence the thermal conductivity κ becomes higher as the electrical conductivity σ becomes higher. Therefore, if a secondary phase having a high electrical conductivity σ is contained in a larger amount such that an increment of the thermal conductivity κ becomes large in comparison with that of the electrical conductivity σ, the figure of merit Z of the whole system is deteriorated.

As stated above, when the amount of the (Ni+B) is in excess, the full-Heusler phase is sometimes precipitated in the material. Because the full-Heusler phase is a metallic phase, the precipitation of the full-Heusler phase may deteriorate the thermoelectric property. In order to obtain a high thermoelectric property, the ratio of the maximum peak intensity is preferably less than 18%. The ratio thereof is more preferably 10% or less, still more preferably 5% or less.

Herein, the ratio of the maximum peak intensity means the value represented by the following equation (b):

$$\text{ratio of the maximum peak intensity} = I_{FULL(220)} \times 100/I_{HALF(220)} \quad (b)$$

where $I_{HALF(200)}$ is the maximum peak intensity in X-ray diffraction of the half-Heusler phase contained in a thermoelectric material and $I_{FULL(220)}$ is the maximum peak intensity in X-ray diffraction of the full-Heusler phase contained in a thermoelectric material.

[1.6. Thermoelectric Property]

As stated above, when the ratio of (Ni+B)/(Sn+C) is made larger than 1 (y>0), or when, in addition to that, a dopant is added to one or more of the Ti sites, Ni sites and Sn sites, a high thermoelectric property can be obtained.

Specifically, by satisfying y>0, the thermal conductivity x at room temperature can be made 4 W/mK or less, without addition of a heavy element such as Zr and Hf. Further, even when a dopant is not added to any of the Ti sites, Ni sites and Sn sites, the ZT value at room temperature can be made 0.05 or more. Further, the ZT value can be made 0.07 or more.

[2. Method of Manufacturing Thermoelectric Material (1)]

A method of manufacturing a thermoelectric material according to a first embodiment of the present invention is a method of manufacturing a thermoelectric material containing a TiNiSn half-Heusler compound, and the method includes a melting and casting step, a rapid cooling step and a sintering step.

[2.1. Melting and Casting Step]

In the melting and casting step, a raw material weighed so as to become the TiNiSn half-Heusler compound according to the present embodiment is melted and the resultant molten metal is cast.

The way of melting the raw material is not particularly limited, and various ways can be adopted. Specifically, examples of the way of melting the raw material include the arc-melting method, the high-frequency induction melting method and the glass tube sealed annealing method, etc. The melting of the raw material is preferably performed under inert environment to prevent oxidation.

The molten metal may be directly subjected to rapid solidification, without remelting an ingot that is melted and cast in advance. In this case, the melting and casting step can be omitted.

[2.2. Rapid Cooling Step]

In the rapid cooling step, the molten metal obtained by melting the raw material weighed so as to become the TiNiSn half-Heusler compound according to the present embodiment is rapidly solidified. Although the TiNiSn half-Heusler compound according to the present embodiment can be obtained by simply melting the raw material and casting the resultant molten metal, a crystal grain of the compound can be fine and the thermal conductivity κ can be reduced by rapid cooling. Further, the precipitation of the secondary phase can be suppressed by the rapid cooling.

Herein, "molten metal" may be what the ingot produced in the melting and casting step is remelted to, or what is obtained by melting a mixture of the constituent elements.

The rapid solidification is performed by spraying or dropping the molten metal into a cooling medium with the use of a nozzle. In the rapid solidification, although a quartz nozzle is typically used as the nozzle, a nozzle made of boron nitride is preferably used in the present invention. The nozzle made of boron nitride is less reactive with the molten metal, and therefore, in the rapid solidification using the nozzle, shift of the composition, infiltration of impurities, and the decrease in the thermoelectric property resulting from the above phenomena can be suppressed.

Specifically, examples of the rapid solidification method include the following methods:

(1) A method in which a molten metal melted within the nozzle made of boron nitride is sprayed or dropped on a rotating copper roll (cooling medium) (copper rolling method); and (2) A method in which a molten metal melted within the nozzle made of boron nitride is sprayed or dropped from a nozzle hole such that a flow of the molten metal is blown by a jet fluid from the surroundings, and then the resultant droplets are solidified while falling (atomization method).

When using the atomization method as the rapid solidification method, an inert gas (for example, Ar, etc.) is preferably used for the jet fluid, to prevent oxidation of the molten metal.

The nozzle made of boron nitride may be used as it is; however, it is preferable that the nozzle is subjected in advance to a heat treatment at 600° C. or higher under an inert gas atmosphere (for example, Ar, $N_2$, etc.) prior to the melting of the raw material. Although a gas and moisture are adsorbed on the boron nitride immediately after manufacturing, the adsorbed gas and moisture are removed by the heat treatment under predetermined conditions, allowing infiltration of impurities (in particular, O) to be reduced to the minimum.

A cooling rate at the rapid cooling is preferably 100° C./sec or more. When the cooling rate is less than 100° C./sec, a constituent element is segregated, sometimes failing to obtain a uniform solid solution. In order to obtain a uniform solid solution, the higher the cooling rate, the better.

[2.3. Sintering Step]

In the sintering step, the ingot obtained in the melting and casting step, or the solidified product obtained in the rapid cooling step, is grinded, molded and sintered. After the ingot or the solidified product is, if necessary, grinded to an appropriate degree, it can be used in various applications as it is. Accordingly, the sintering step is not necessarily required; however, when the ingot or the solidified product is to be used in a bulk state, sintering is usually performed.

When sintering a powdered TiNiSn half-Heusler compound, various sintering methods can be adopted. Specifically, examples of the sintering methods include the normal pressure sintering method, hot press method, HIP method, and spark plasma sintering method (SPS). Among them, the spark plasma sintering method is particularly suitable as a sintering method because a dense sintered body can be obtained in a short period of time.

Among sintering conditions (for example, sintering temperature, sintering time, pressure applied during sintering, atmosphere at sintering, etc.), the optimal conditions are to be selected in accordance with the composition of the TiNiSn half-Heusler compound and the sintering method to be used, etc.

For example, when using the spark plasma sintering method, the sintering temperature is preferably equal to or lower than the melting point of the TiNiSn half-Heusler compound, and the applied pressure is preferably 20 MPa or more. When the applied pressure is 20 MPa or more, a dense sintered body can be obtained. With respect to the sintering time, the optimal time is selected so as to obtain a dense sintered body in accordance with the sintering temperature.

[2.4. Other Steps]

After the powder is sintered, an annealing treatment may be performed so as to maintain the sintered body at a predetermined temperature. When the annealing treatment is performed on the sintered body, segregation of a constituent element and the precipitated secondary phase, etc., can be removed.

The annealing temperature is preferably 700° C. or higher and equal to or lower than the melting point of the TiNiSn half-Heusler compound. When the annealing temperature is lower than 700° C., a sufficient effect cannot be obtained.

With respect to the annealing time, the optimal time is selected in accordance with the annealing temperature. In general, the segregation of an element, etc., can be removed in a shorter time as the annealing temperature becomes higher. The annealing time is usually determined between several hours and several tens of hours.

[3. Thermoelectric Material (2)]

A thermoelectric material according to a second embodiment of the present invention contains a half-Heusler compound having a predetermined composition.

[3.1. Crystal Structure]

Details of the crystal structure of the half-Heusler compound are the same as those in the first embodiment, and hence descriptions with respect to the structure will be omitted.

[3.2. Number of Valence Electrons]

Details of the number of valence electrons of the half-Heusler compound are the same as those in the first embodiment, and hence descriptions with respect thereto will be omitted.

[3.3. Constituent Elements]

In the present embodiment, the half-Heusler compound (hereinafter, referred to as "ZrNiSn half-Heusler compound") has a composition represented by the following equation (2):

$$(Zr_{1-a}A_a)_{1+x}(Ni_{1-b}B_b)_{1+y}(Sn_{1-c}C_c) \quad (2)$$

where $0 \leq a < 0.1$, $0 \leq b < 0.1$ and $0 \leq c < 0.1$;
$-0.1 \leq x \leq 0.2$, $0 < y \leq 0.2$;

A is one or more elements selected from the group consisting of group IIIa elements, group IVa elements (excluding Zr), group Va elements and rare earth elements;

B is one or more elements selected from the group consisting of group VIIIa elements (excluding Ni) and group Ib elements; and C is one or more elements selected from the group consisting of group IIIb elements, group IVb elements (excluding Sn) and group Vb elements, wherein an amount of Hf substitution at the Zr sites of the ZrNiSn half-Heusler compound is less than 1 at %.

"A" means an element (dopant) substituting the Zr sites. The element A may be any one of group IIIa elements ($_{21}$Sc, $_{39}$Y), group IVa elements excluding Zr ($_{22}$Ti, $_{72}$Hf), group Va elements ($_{23}$V, $_{41}$Nb, $_{73}$Ta), or rare earth elements ($_{57}$La to $_{71}$Lu).

"B" means an element (dopant) substituting the Ni sites. The element B may be any one of group VIIIa elements excluding Ni ($_{26}$Fe, $_{27}$CO, $_{44}$Ru, $_{45}$Rh, $_{46}$Pd, $_{76}$Os, $_{77}$Ir, $_{78}$Pt) or group Ib elements ($_{29}$Cu, $_{47}$Ag, $_{79}$Au).

"C" means an element (dopant) substituting the Sn sites. The elements C may be any one of group IIIb elements ($_5$B, $_{13}$Al, $_{31}$Gs, $_{49}$In, $_{81}$Tl), group IVb elements excluding Sn ($_6$C, $_{14}$Si, $_{32}$Ge, $_{82}$Pb), or group Vb elements ($_7$N, $_{15}$P, $_{33}$As, $_{51}$Sb, $_{83}$Bi).

Among them, the element A is preferably any one or more selected from the group consisting of Y, Sc, Nb, V, Ta and rare earth elements.

The element B is preferably any one or more selected from the group consisting of Cu, Ag, Au, Pd, and Pt.

The element C is preferably one or more selected from the group consisting of Al, Si and Sb.

These elements are relatively inexpensive and have significant effects of increasing the power factor PF without a great increase in the thermal conductivity κ, and therefore are suitable as elements substituting each site.

"a" represents an amount of substitution of the Zr sites by the element A. "b" represents an amount of substitution of the Ni sites by the element B. "c" represents an amount of substitution of the Sn sites by the element C.

If each site is substituted with elements, the numbers of valence electrons of which are the same as or different from that of the elements at the site, the carrier concentration is increased, or the phonon scattering is increased. However, when an amount of substitution of each site is in excess, the generation rate of a secondary phase is increased, and hence thermoelectric property is contrarily decreased. Accordingly, a, b and c are needed to be less than 0.1, respectively. More preferably, a, b and c are 0.05 or less, respectively.

When Hf is used as the element A, the amounts of substitution by Hf are limited to less than 0.01 (1 at %).

"x" represents a shift of the elements (Zr+A) occupying the Zr sites from the stoichiometric composition. Even when the amount of the (Zr+A) is shifted from the stoichiometric composition, the lattice defect and the thermoelectric property in the half-Heusler compound are not affected so much.

However, when the amount of the (Zr+A) is too small in comparison with the stoichiometric composition, there is a problem in that the secondary phases such as the $ZrNi_2Sn$ full-Heusler compound, Sn, Ni and Ni—Sn alloy, are precipitated. Accordingly, x is needed to be −0.1 or more. x is preferably −0.05 or more, more preferably −0.01 or more.

On the other hand, when the amount of the (Zr+A) is in excess in comparison with the stoichiometric composition, the secondary phases having the excessive Zr as their major components (for example, metallic Zr phase, $Zr_6Sn_5$, etc.) are precipitated in the material. Accordingly, x is needed to be 0.2 or less. x is preferably 0.15 or less, more preferably 0.1 or less.

"y" represents a shift of the elements (Ni+B) occupying the Ni sites from the stoichiometric composition. When an amount of the (Ni+B) is in excess relative to the elements (Sn+C) occupying the Sn sites, the excessive (Ni+B) are introduced into 4d sites. The (Ni+B) introduced into the 4d sites have functions of reducing the thermal conductivity κ of the half-Heusler compound without decreasing the power factor PF. Accordingly, y is needed to be more than 0. y is preferably 0.01 or more, more preferably 0.031 or more, still more preferably 0.04 or more.

On the other hand, when the amount of the (Ni+B) is in excess in comparison with the stoichiometric composition, the full-Heusler phase is precipitated in the material. Because the full-Heusler phase is a metallic phase, the precipitation of the full-Heusler phase causes the thermoelectric property to be deteriorated. Accordingly, y is needed to be 0.2 or less. y is preferably 0.10 or less, more preferably 0.06 or less, still more preferably 0.05 or less.

[3.4 Lattice Constant of ZrNiSn Half-Heusler Compound]

When the amount of the (Ni+B) is in excess in comparison with the stoichiometric composition, and the manufacturing conditions are optimized, the excessive (Ni+B) are introduced into the 4d sites. As a result, the lattice constant of the ZrNiSn half-Heusler compound is increased. That is, the increase in the lattice constant is correlated with the amount of the (Ni+B) introduced into the 4d sites.

In order to reduce the thermal conductivity κ without the decrease in the power factor PF, the lattice constant of the ZrNiSn half-Heusler compound (major phase) is preferably 0.6110 nm or more, more preferably 0.6115 nm or more, still more preferably 0.6118 nm.

On the other hand, when performing doping on any one or more of the Zr sites, Ni sites and Sn sites in order to improve the power factor PF, the ZrNiSn half-Heusler compound having a lattice constant of up to 0.6130 nm can be obtained.

For example, in the case of a Zr—Ni—Sn sintered body containing no dopant, the lattice constant of the half-Heusler phase can be varied by controlling the Ni/Sn ratio. Specifically, by varying the y value, the Zr half-Heusler compound with the lattice constant of 0.6110 nm to 0.6130 nm (inclusive) can be obtained.

[3.5. Impurities]

Although the thermoelectric material according to the present invention is preferably made of only the aforementioned ZrNiSn half-Heusler compound, inevitable impurities (secondary phase) may be contained. However, the secondary phase adversely affecting the thermoelectric property is preferably contained in small amounts.

Further, the thermoelectric material according to the present embodiment may be a complex of the aforementioned ZrNiSn half-Heusler compound and other materials (for example, resin and rubber, etc.).

Herein, "secondary phase" means the phases different from that of the ZrNiSn half-Heusler compound. Among them, the secondary phase having a high electrical conductivity σ causes the electrical conductivity σ of the whole system to be elevated. The electrical conductivity σ and the thermal conductivity κ generally have a positive correlation with each other, and hence the thermal conductivity κ becomes higher as the electrical conductivity a becomes higher. Therefore, if a secondary phase having a high electrical conductivity σ is contained in a larger amount such that an increment of the thermal conductivity κ becomes large in comparison with that of the electrical conductivity σ, the figure of merit Z of the whole system is deteriorated.

As stated above, when the amount of the (Ni+B) is in excess, the full-Heusler phase is sometimes precipitated in the material. Because the full-Heusler phase is a metallic phase, the precipitation of the full-Heusler phase may deteriorate the thermoelectric property. In order to obtain a high thermoelectric property, the ratio of the maximum peak intensity is preferably less than 6%. The ratio thereof is more preferably 5% or less, still more preferably 4% or less.

Herein, the ratio of the maximum peak intensity means the value represented by the following equation (b):

$$\text{ratio of the maximum peak intensity} = I_{FULL(220)} \times 100 / I_{HALF(220)} \quad (b)$$

where $I_{HALF(220)}$ is the maximum peak intensity in X-ray diffraction of the half-Heusler phase contained in a thermoelectric material and $I_{FULL(220)}$ is the maximum peak intensity in X-ray diffraction of the full-Heusler phase contained in a thermoelectric material.

[3.6. Thermoelectric Property]

As stated above, when the ratio of (Ni+B)/(Sn+C) is made larger than 1 (y>0), or when, in addition to that, a dopant is added to one or more of Zr sites, Ni sites and Sn sites, a high thermoelectric property can be obtained.

Specifically, by satisfying y>0, the thermal conductivity κ at room temperature can be made 6.7 W/mK or less, without addition of a heavy element such as Hf.

Further, even when a dopant is not added to any of the Zr sites, Ni sites and Sn sites, the ZT value at 773 to 873 K can be made 0.35 or more.

[4. Method of Manufacturing Thermoelectric Material (2)]

A method of manufacturing a thermoelectric material according to a second embodiment of the present invention is a method of manufacturing a thermoelectric material containing a ZrNiSn half-Heusler compound, and the method includes a melting and casting step, a rapid cooling step and a sintering step.

The method of manufacturing a thermoelectric material according to the present embodiment is the same as that according to the first embodiment, except that the starting material is weighed such that the ZrNiSn half-Heusler compound having the composition represented by the equation (2) is obtained. Therefore, descriptions with respect to the method will be omitted.

[5. Effect of Thermoelectric Material and Method of Manufacturing the Material]

In general, conversion efficiency of a thermoelectric material has a one-on-one correspondence relationship with the dimensionless figure of merit ZT, in which the larger the ZT, the higher the conversion efficiency. The figure of merit ZT is represented by the following equation:

$$ZT = [(\sigma \times S^2)/\sigma] \times T = PF/\kappa \times T$$

(where σ: electrical conductivity, S: Seebeck coefficient, κ: thermal conductivity, T: absolute temperature)

From the above equation, it can be appreciated that PF (power factor) has to be improved or κ has to be reduced in order to improve ZT.

Typically, the thermal conductivity κ is given by a sum of a contribution by the carrier ($\kappa_{carr}$) and that by the lattice vibration ($\kappa_{ph}$), as shown below:

$$\kappa = \kappa_{carr} + \kappa_{ph}$$

In a thermoelectric material, however, the carrier concentration is usually selected such that ZT takes a maximum value, and at the carrier concentration, $k_{carr} \ll k_{ph}$ holds. Therefore, the thermal conductivity is dependent on the magnitude of the $k_{ph}$, in the end. The lattice thermal conductivity is reduced by scattering due to various incompleteness of a substance (impurities, structure defect, etc.)

As a way to reduce the thermal conductivity κ, a method is known in which some of elements of which the compound is composed is substituted with a heavy element. For example, the method in which some of Ti of TiNiSn is substituted with Zr or Hf, and the method in which some of Ni of ZrNiSn is substituted with Pd or Pt, etc. are known. However, because heavy elements are generally rare and expensive, reduction in the thermal conductivity by the substitution with the use of a heavy element results in high cost of a thermoelectric material.

On the other hand, the TiNiSn (ZrNiSn) has a crystal structure in which Ti—Sn (Zr—Sn) forms a rock salt-type lattice with half of the body-centered positions being occupied by Ni and the remaining half existing as non-occupied vacancies. When Ni is contained in an excessive amount relative to the TiNiSn (ZrNiSn) having the stoichiometric composition, the excessive Ni occupies the vacancies at random. In the lattice occupied by Ni, the lattice constant thereof is increased in comparison with the lattice not occupied. Therefore, the phonons are scattered due to the disagreement of lattice constants (namely, incompleteness of crystal), allowing $\kappa_{ph}$ to be reduced.

Such incompleteness may possibly decrease the electrical conductivity by simultaneously scattering the carriers. However, because the mean free path of the carrier is generally small in comparison with that of the phonon, the phonons are decreased at a higher rate, allowing the dimensionless figure of merit to be increased.

Further, by the method of introducing defects into the Ni sites, the thermal conductivity κ can be reduced without the use of a large amount of an expensive heavy element, allowing the thermoelectric material to be manufactured at a low cost.

Moreover, the Seebeck coefficient S and the electrical conductivity σ are affected by the introduction of the Ni site atoms into the vacancies (4d sites). Accordingly, when the y value is optimized, the thermal conductivity κ can be reduced, and at the same time, the power factor PF can be increased. In particular, when an Ni interstitial defect is introduced into the ZrNiSn half-Heusler compound, a high power factor (4.6 mW/K$^2$m) can be obtained by optimizing the carrier concentration, in comparison with that of the TiNiSn half-Heusler compound (3.8 mW/K$^2$m).

Further, when an appropriate dopant is added to the Ti sites (or Zr sites), Ni sites and/or Sn sites, in addition to the introduction of the excessive Ni site atoms into interstitial sites, the power factor PF can be further increased while maintaining the thermal conductivity κ at a low level.

Further, when the composition and the manufacturing conditions are optimized such that the ratio of the maximum peak intensity of the full-Heusler phase to the half-Heusler phase is less than a predetermined value, the decrease in the thermoelectric property due to the precipitation of the full-Heusler phase can be suppressed.

EXAMPLES

Example 1

[1. Production of Samples]

Ti (purity: 99.9% or more), Ni (purity: 99.9%) and Sn (purity: 99.9% or more) were weighed such that their feed values could produce $Ti_{1-\alpha}Ni_{1-\alpha}Sn$ (−0.05≦α≦0.05) or $TiNi_{1+\beta}Sn$ (−0.01≦β≦0.03). These were placed into a crucible made of boron nitride, and then placed in a high frequency induction furnace. After evacuating the inside of the furnace to 10$^{-3}$ Pa range, Ar gas was introduced until the internal pressure within the chamber was raised to 0.34×10$^5$ Pa. Subsequently, high frequency current was applied to a coil such that the raw material in the crucible was melted. After the material was melted, the resultant molten metal was furnace cooled to obtain an ingot.

The resultant ingot was remelted within a pipe made of boron nitride, and then the molten metal was rapidly cooled on a Cu roll surface rotating at 3000 rpm to obtain a ribbon-shaped sample. The sample was ground and then sintered under a pressure of 50 MPa at 1100° C.×15 minutes by using a spark plasma sintering apparatus.

[2. Test Method]

[2.1. Composition Analysis]

The resultant sintered body was subjected to ICP composition analysis.

[2.2. X-ray Diffraction]

X-ray diffraction patterns of the resultant sintered body were measured.

[2.3. Thermoelectric Property]

Samples were cut out of the sintered body such that the Seebeck coefficient S, electrical conductivity σ and thermal conductivity κ were measured. The power factor PF and dimensionless figure of merit ZT were calculated by using the measured Seebeck coefficient S, electrical conductivity σ and thermal conductivity κ.

[2.4. Band Calculation]

Formation energy was calculated by the electronic structure calculation program VASP (plane wave-PAW method using the density functional theory), and the stability of the structure defect in TiNiSn was evaluated. GGA was used for the exchange correlation potential. The formation energy (FE) is defined as FE(AB→AC)=E(AC)−[E(AB)+E(C)−E(B)]. E is the total energy, meaning that, as FE is lower, the substance AC can be more easily synthesized from the substance AB.

[3. Result]

[3.1. Ni/Sn Ratio and Ti/Sn Ratio]

The Ni/Sn ratio and the Ti/Sn ratio of the synthesized Ti—Ni—Sn sintered body were calculated from the ICP composition analysis (Table 2).

TABLE 2

| | |
|---|---|
| Sample 1 | $Ti_{1.101}Ni_{0.984}Sn$ |
| Sample 2 | $Ti_{1.059}Ni_{1.025}Sn$ |
| Sample 3 | $Ti_{1.019}Ni_{1.047}Sn$ |
| Sample 4 | $Ti_{1.027}Ni_{1.063}Sn$ |
| Sample 5 | $Ti_{1.054}Ni_{1.075}Sn$ |
| Sample 6 | $Ti_{1.035}Ni_{1.099}Sn$ |
| Sample 7 | $Ti_{1.034}Ni_{1.155}Sn$ |

[3.2. Lattice Constant]

Figure 2:
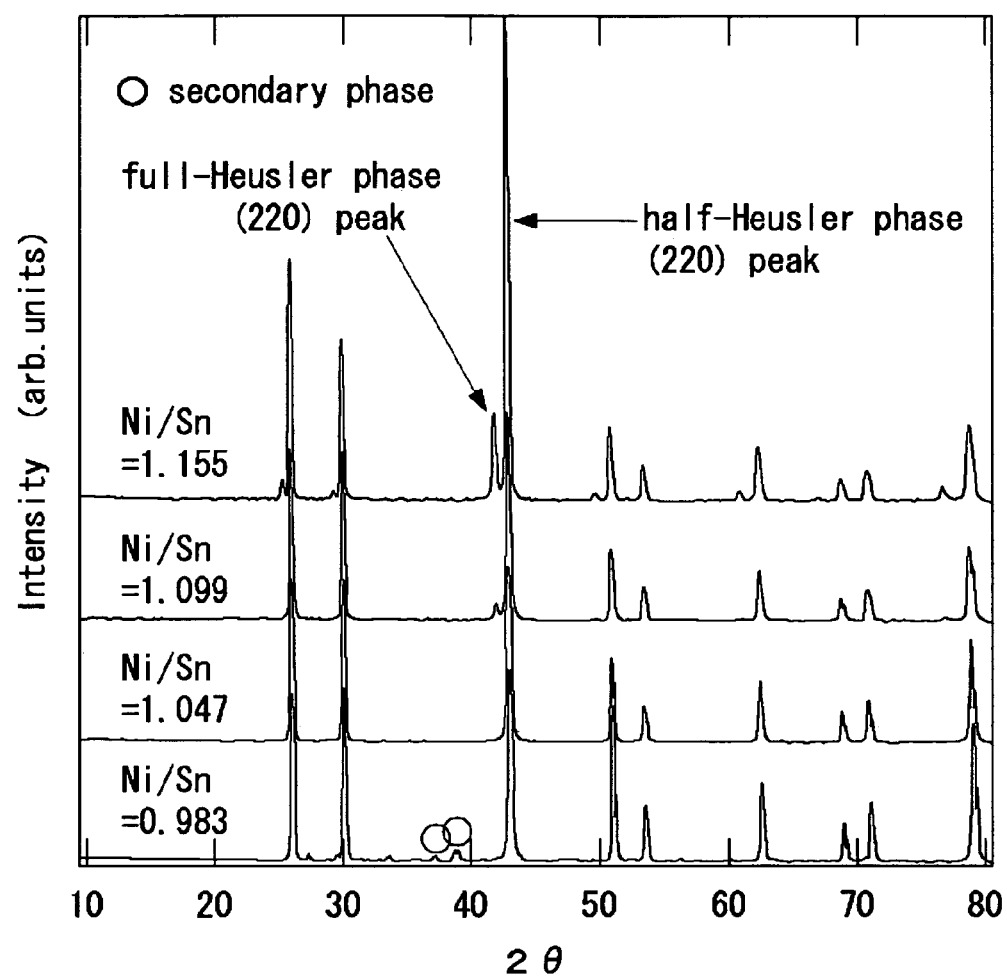
FIG. 2 is a graph illustrating X-ray diffraction patterns of a Ti—Ni—Sn sintered body.
Figure 3:
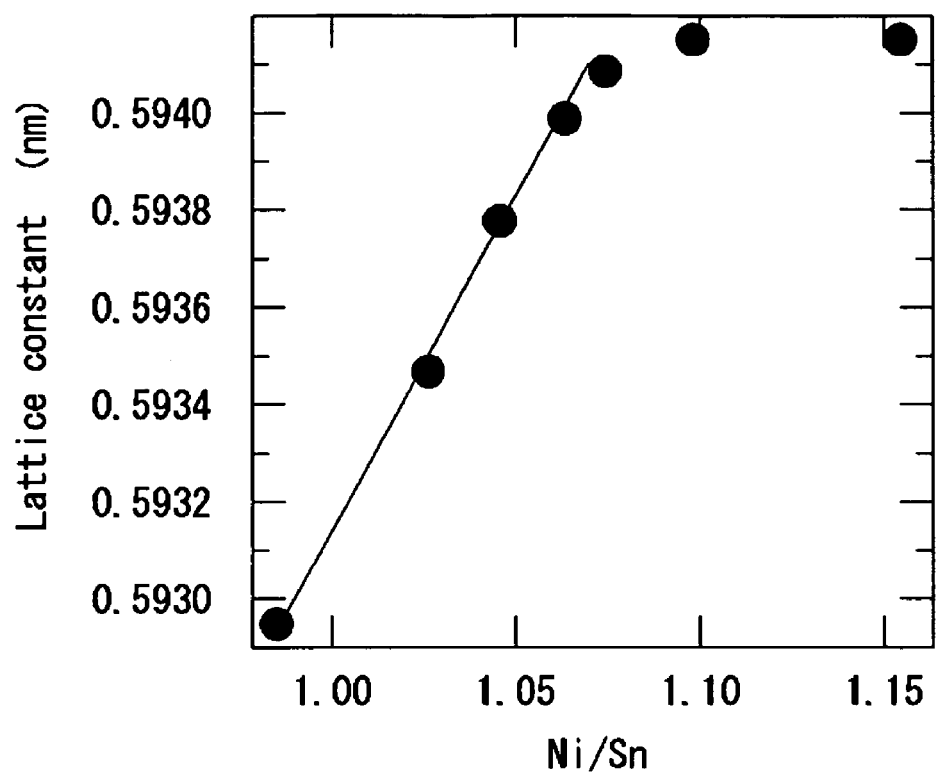
FIG. 3 is a graph illustrating influence of the Ni/Sn ratio on the lattice constant of the Ti—Ni—Sn half-Heusler phase.

FIG. 2 shows X-ray diffraction patterns of the Ti—Ni—Sn sintered body. FIG. 3 shows the relationship between the lattice constant of the Ti—Ni—Sn half-Heusler phase, determined from the X-ray diffraction patterns, and the Ni/Sn ratio.

In the samples 2 to 6, there is almost no X-ray diffraction peak of a secondary phase, and the lattice constant is increased with the increase in the Ni/Sn ratio. Further, the lattice constant is not too much dependent on the amount of Ti, and is mainly determined by the Ni/Sn ratio.

[3.3. Thermoelectric Property]

[3.3.1 Power Factor PF]

Figure 4:
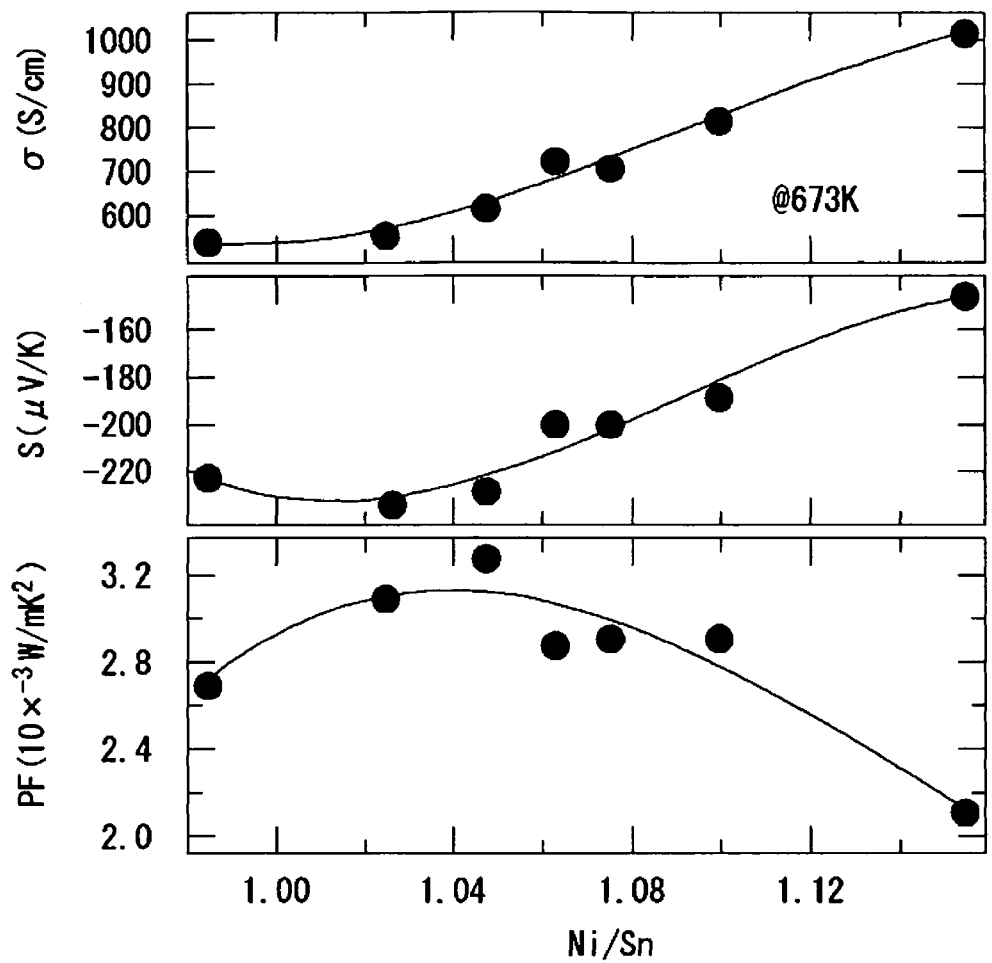
FIG. 4 is graphs illustrating the relationships between the Ni/Sn ratio and the electrical conductivity σ, the Ni/Sn ratio and the Seebeck coefficient S, and the Ni/Sn ratio and the power factor PF, of the Ti—Ni—Sn sintered body at 673 K.

FIG. 4 shows the electrical conductivity σ, Seebeck coefficient S and power factor PF of the Ti—Ni—Sn sintered body at 673 K. In the samples 2 to 6, because there is not too much influence by the secondary phase, the power factor PF exhibits relatively high values (2.89 to 3.29×10$^{-3}$ W/mK$^2$), even when the Ni/Sn ratio is increased.

When Ni/Sn=1.155 (sample 7), the precipitation of the full-Heusler phase is remarkable, and hence the power factor PF is lower than those of other materials. In this case, the ratio of the maximum peak intensity ($=I_{FULL(220)} \times 100/I_{HALF(220)}$) was 18%. Accordingly, in order to realize a high dimensionless figure of merit, the ratio of the maximum peak intensity is needed to be less than 18%.

[3.3.2 Dimensionless Figure of Merit ZT]

Figure 5:
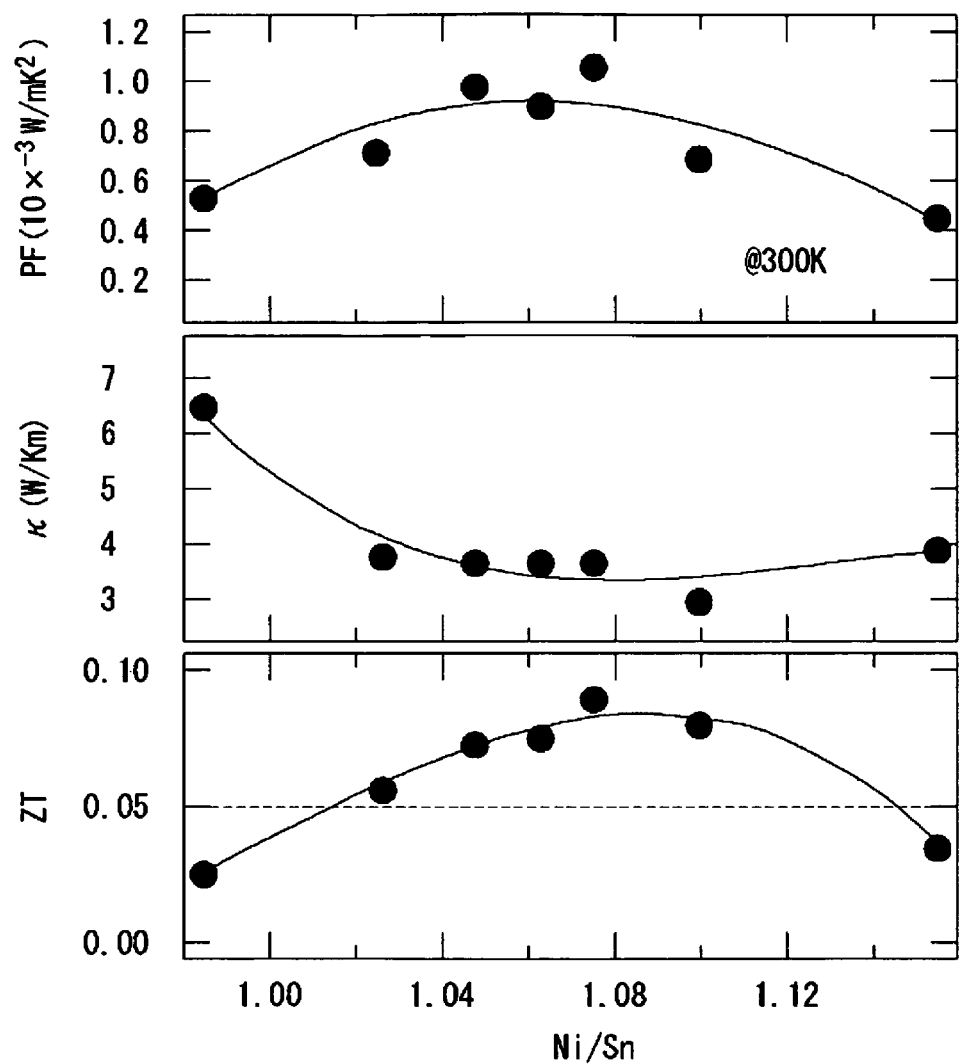
FIG. 5 is graphs illustrating the relationships between the Ni/Sn ratio and the power factor PF, the Ni/Sn ratio and the thermal conductivity κ and the Ni/Sn ratio and the dimensionless figure of merit ZT, of the Ti—Ni—Sn sintered body at 300 K.

FIG. 5 shows the power factor PF, thermal conductivity κ and dimensionless figure of merit ZT of the Ti—Ni—Sn sintered body at 300 K. The dimensionless figure of merit ZT was improved by reducing the thermal conductivity κ. When the Ni/Sn ratio is within the range of 1.015 to 1.145 (inclusive), the dimensionless figure of merit ZT exceeds the maximum disclosed in Patent Document 6. When the Ni/Sn ratio is within the range of 1.047 to 1.123 (inclusive), ZT is 0.07 or more.

Taking into consideration the lattice constant of the half-Heusler phase that is the major phase, the dimensionless figure of merit ZT becomes higher than those of conventional thermoelectric materials when the lattice constant is 0.5933 nm or more. In particular, when the lattice constant is 0.5937 nm or more, ZT becomes higher than 0.07. It is thought that the reduction in the thermal conductivity is brought by Ni introduced in excess forming crystal structure defects, which scatter phonons.

In order to investigate what type of defect was introduced, defect models having excessive Ni relative to Sn were designed, and the formation energies FE were evaluated by the First Principle Calculation.

Figure 6:
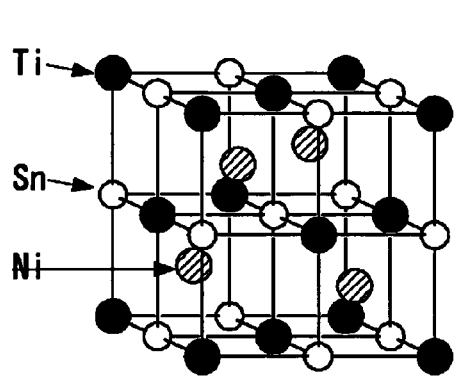
FIG. 6 is defect models used in the First Principle Calculation: the upper left view in FIG. 6 illustrates the TiNiSn crystal lattice having no defect, FIG. 6($a$) illustrates a model in which an Sn point defect (vacancy) is introduced, FIG. 6($b$) a model in which the Sn sites are substituted with Ti, FIG. 6($c$) a model in which the Ti sites are substituted with Ni, FIG. 6($d$) a model in which the Sn sites are substituted with Ni, and FIG. 6($e$) a model of an interstitial solid solution in which Ni is introduced into a interstitial site.
Figure 6:
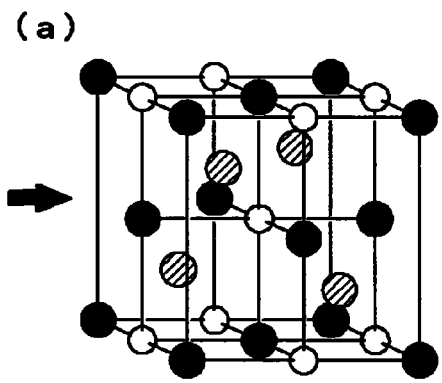
Figure 6:
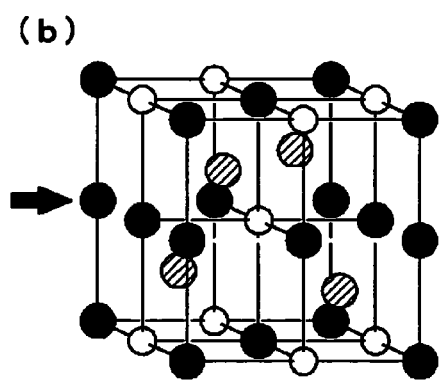
Figure 6:
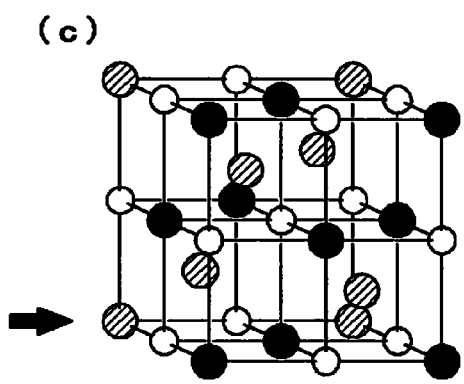
Figure 6:
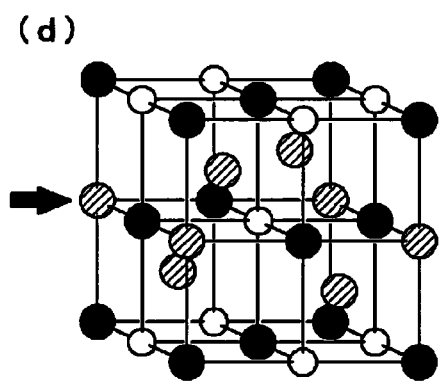
Figure 6:
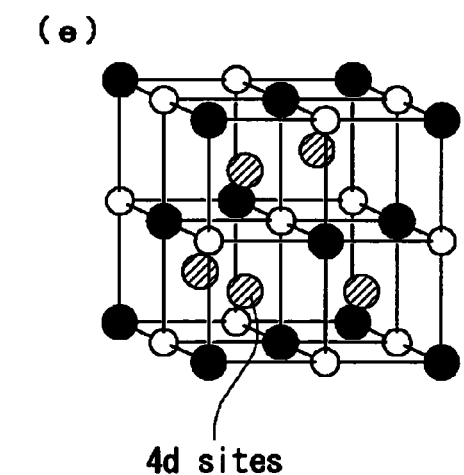

The designed defect models are as follows: (a) a model in which an Sn point defects (vacancies) are introduced (FIG. 6(a)); (b) a model in which the Sn sites are substituted with Ti (FIG. 6(b)); (c) a model in which the Ti sites are substituted with Ni (FIG. 6(c)); (d) a model in which the Sn sites are substituted with Ni (FIG. 6(d)); and (e) a model of an interstitial solid solution in which Ni are introduced into interstitial sites (FIG. 6(e)). The band calculation was performed after one of the aforementioned defects was introduced into the superlattice of the $Ti_{32}Ni_{32}Sn_{32}$.

Figure 7:
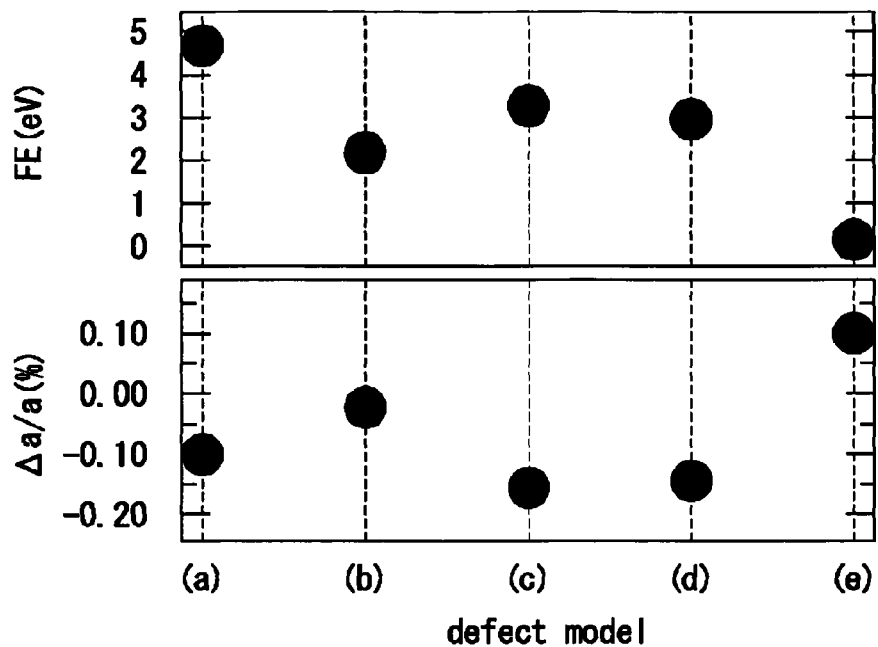
FIG. 7 is graphs illustrating formation energy (FE) of the defect in the defect model illustrated in FIG. 6, and change of the lattice constant ($\Delta a/a$) by the introduction of the defect.

FIG. 7 shows the formation energy of each defect model and change of the lattice constant ($\Delta a/a$) when the defect is introduced. As a result, it was indicated that the formation energy of the defect in which Ni was introduced into the interstitial sites (interstitial Ni defect) was small, and the interstitial Ni defect was easily formed. Further, only the interstitial Ni defect increased the lattice constant, which matched the experimental results. Accordingly, it is considered that Ni introduced in excess forms the interstitial Ni defects, contributing to great reduction in the thermal conductivity $\kappa$.

Example 2

[1. Production of Samples]

In order to substitute the relevant sites of the sample 6 of Example 1 as a base material, the following weighing was performed:

(1) The Sn sites thereof were to be substituted with Sb (up to 1%);
(2) The Ni sites thereof were to be substituted with Cu (up to 0.5%); or
(3) The Sn sites thereof were to be substituted with Sb, and the Ti sites thereof was to be substituted with Y whose amount was the same as that of Sb (up to 3%). The purities of Sb, Cu and Y thus used are 99.9% or more, respectively.

These substances were placed in a crucible made of boron nitride, and then placed in a high frequency induction furnace. After evacuating the inside of the furnace to $10^{-3}$ Pa range, Ar gas was introduced until the internal pressure within the chamber was raised to $0.34 \times 10^5$ Pa. Subsequently, high frequency current was applied to a coil such that the raw material in the crucible was melted. After the material was melted, the resultant molten metal was furnace cooled to obtain an ingot. The resultant ingot was remelted within a pipe made of boron nitride, and then the molten metal was rapidly cooled on a Cu roll surface rotating at 3000 rpm to obtain a ribbon-shaped sample. The sample was ground and then sintered under a pressure of 50 MPa at 1100° C.×15 minutes by using a spark plasma sintering apparatus.

[2. Test Method]
[2.1. X-ray Diffraction]

X-ray diffraction patterns of the resultant sintered body were measured.

[2.2. Thermoelectric Property]

Samples were cut out of the sintered body such that the Seebeck coefficient S, electrical conductivity σ and thermal conductivity $\kappa$ were measured. The power factor PF and dimensionless figure of merit ZT were calculated by using the measured Seebeck coefficient S, electrical conductivity σ and thermal conductivity $\kappa$.

[3. Result]
[3.1. Lattice Constant]

Figure 8:
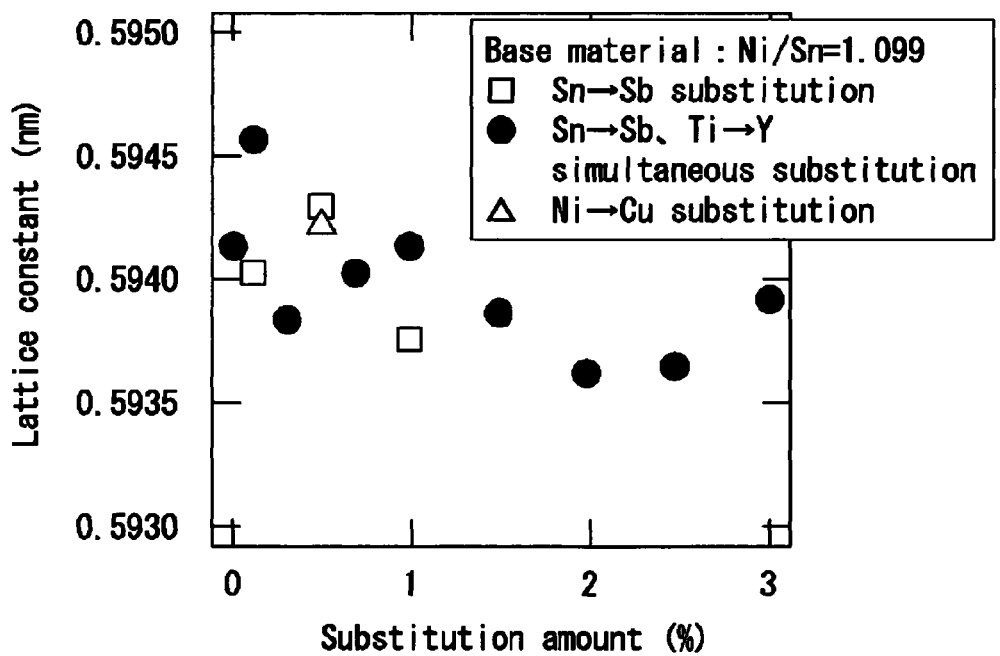
FIG. 8 is a graph illustrating the influence of the amount of substitution on the lattice constant of the Ti—Ni—Sn half-Heusler phase, in which Sb substitution, Cu substitution or Y—Sb simultaneous substitution is performed on sample 6 (Ni/Sn=1.099) as a base material.

FIG. 8 shows lattice constants of the Ti—Ni—Sn half-Heusler phase whose sites were substituted with various elements. The lattice constants were determined from the X-ray diffraction patterns. The lattice constants were not greatly varied by the substitutions of the various elements, which were within the range of 0.5935 nm to 0.5947 nm (inclusive).

[3.2. Thermoelectric Property]

Figure 9:
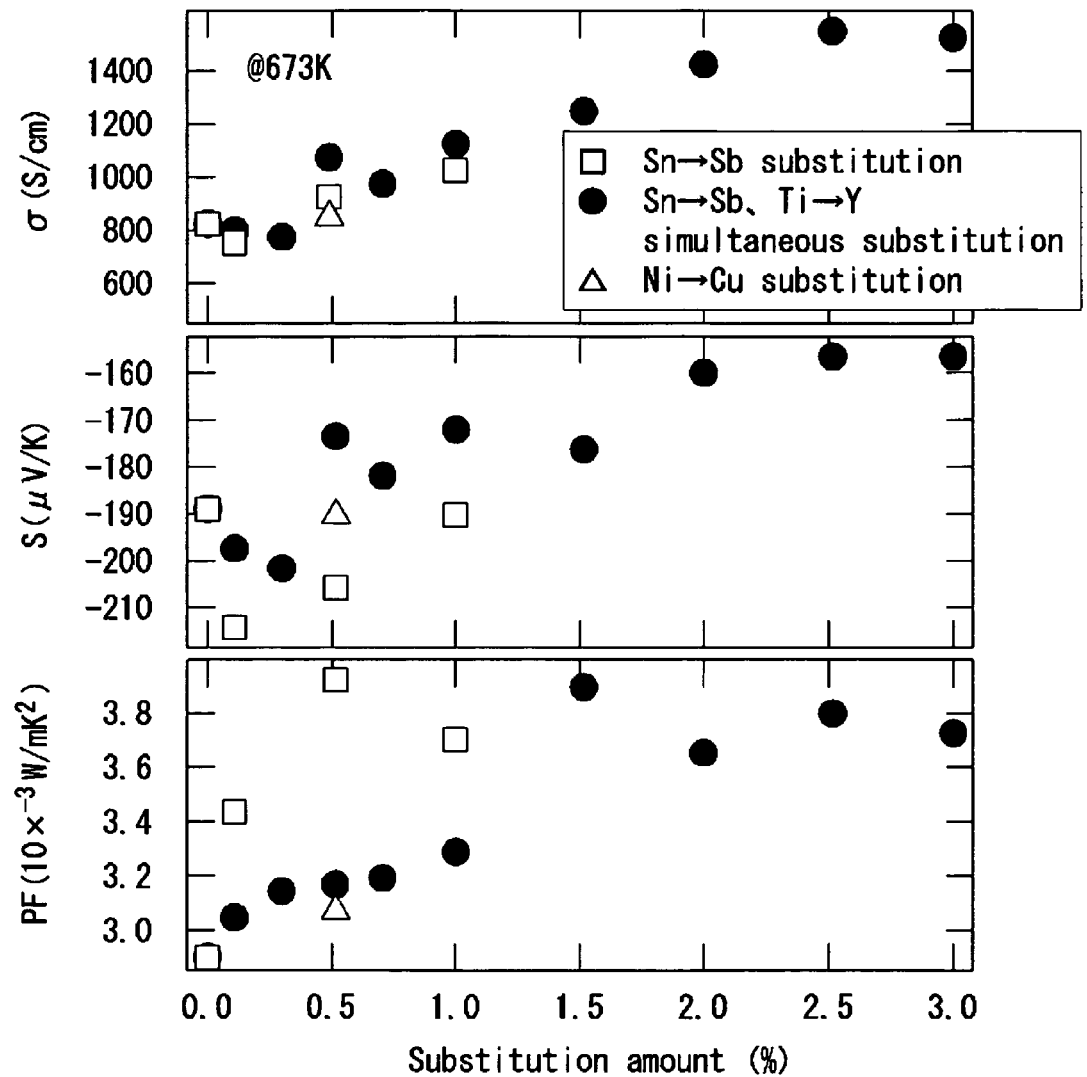
FIG. 9 is a graph illustrating the influence of the amount of substitution on the electrical conductivity σ, the Seebeck coefficient S and the power factor PF of a sintered body at 673 K, the sintered body obtained by performing the Sb substitution, the Cu substitution, or the Y—Sb simultaneous substitution on the sample 6 (Ni/Sn=1.099) as a base material)

FIG. 9 shows the electrical conductivities σ, Seebeck coefficients S and power factors PF of the Ti—Ni—Sn sintered bodies whose sites were substituted with various elements, at 673 K. The power factors PF of the sintered bodies, on which the Sb substitution, Cu substitution and Y—Sb simultaneous substitution were respectively performed, were improved by optimizing the carrier concentrations.

Table 3 shows the power factor PF, thermal conductivity $\kappa$ and dimensionless figure of merit ZT of the Ti—Ni—Sn sintered body on which the Y—Sb simultaneous substitution was performed, at 300 K. In the sintered body on which the Y—Sb simultaneous substitution was performed, the dimensionless figure of merit ZT was better improved than a non-doped sample, due to the increase in the power factor PF.

TABLE 3

| Sn→Sb, Ti→Y simultaneous substitution Substitution amount (%) | PF @300K (W/mK$^2$) | $\kappa$ @300K (W/Km) | ZT @300k |
| --- | --- | --- | --- |
| 0 | 0.00071 | 2.957 | 0.072 |
| 1.0 | 0.00161 | 3.722 | 0.130 |
| 1.5 | 0.00207 | 3.768 | 0.164 |
| 2.0 | 0.00232 | 5.239 | 0.133 |

Example 11

[1. Production of Samples]

Zr, Ni and Sn were weighed such that the whole composition of them was to become $ZrNi_{1+y}Sn$ ($0 \leq y \leq 0.10$), and then they were melted by high frequency induction heating with the use of a crucible made of boron nitride.

The resultant ingot was remelted by high frequency induction heating, and the molten melt was rapidly cooled on a Cu roll surface rotating at 3000 rpm to obtain a ribbon-shaped sample. The sample was ground and then sintered under a pressure of 50 MPa at 1100° C.×15 minutes by using a spark plasma sintering apparatus.

[2. Test Method]
[2.1. Powder X-ray Diffraction]

The resultant sintered body was ground such that X-ray diffraction patterns were measured.

[2.2. Thermoelectric Property]

Samples were cut out of the sintered body such that the Seebeck coefficient S, electrical conductivity σ and thermal conductivity $\kappa$ were measured. The power factor PF and dimensionless figure of merit ZT were calculated by using the measured Seebeck coefficient S, electrical conductivity σ and thermal conductivity $\kappa$.

[3. Result]
[3.1. Powder X-ray Diffraction]

Figure 10:
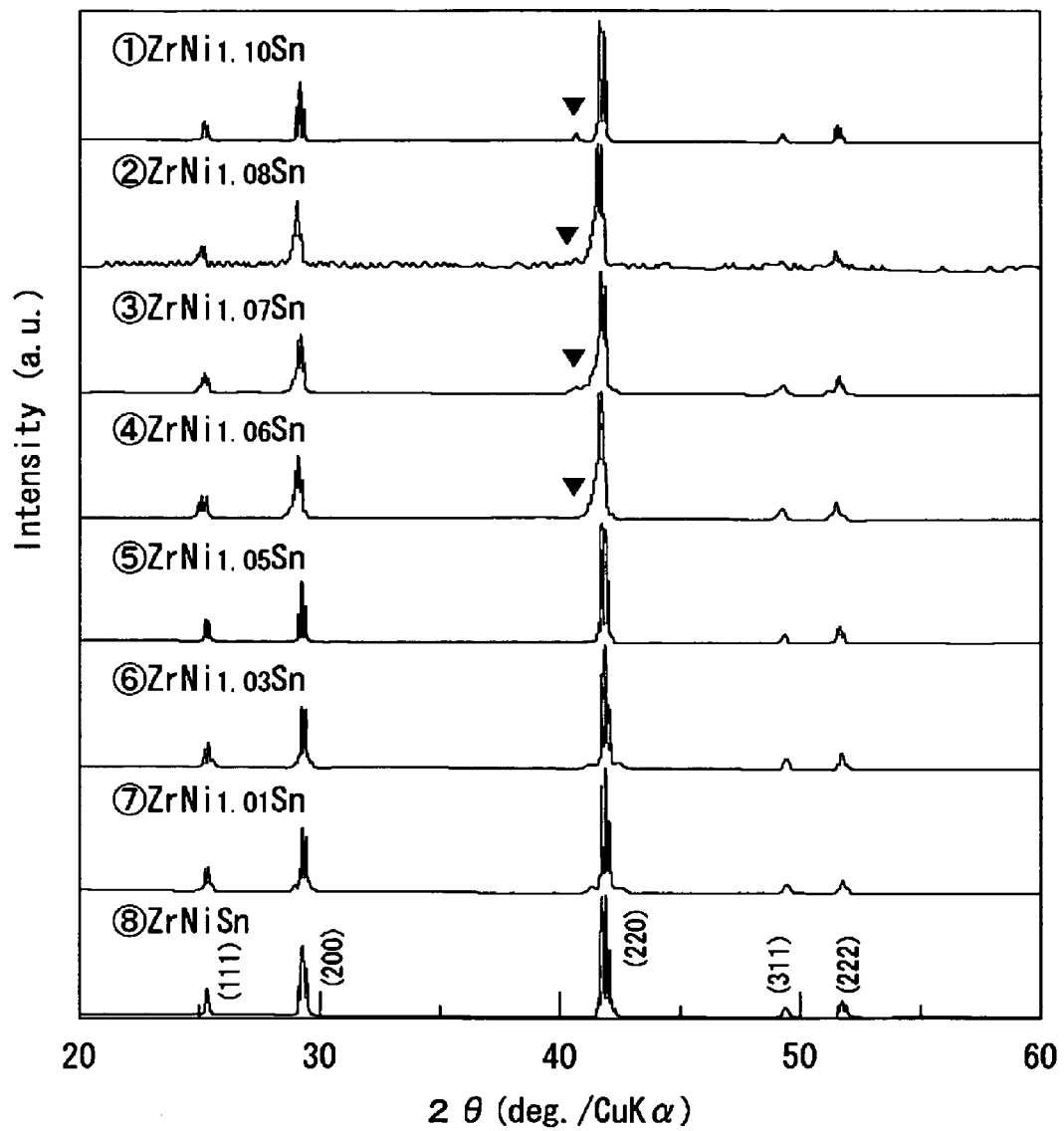
FIG. 10 is a graph illustrating X-ray diffraction patterns of a $ZrNi_{1+y}Sn$ sintered body.
Figure 11:
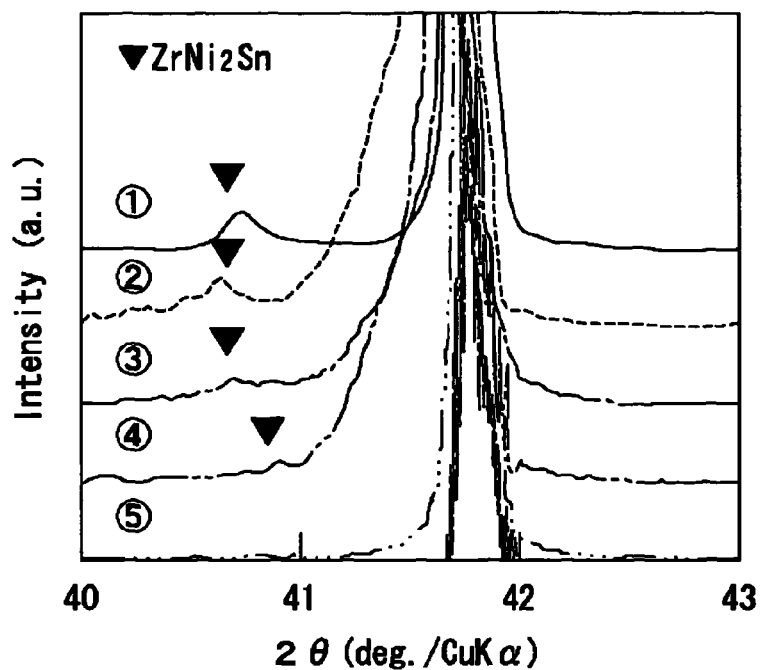
FIG. 11 is a graph illustrating X-ray diffraction patterns near the maximum peak of the $ZrNi_{1+y}Sn$ sintered body.

FIG. 10 shows powder X-ray diffraction patterns of the $ZrNi_{1+y}Sn$ sintered body. FIG. 11 shows the powder X-ray diffraction patterns near the maximum peak of the $ZrNi_{1+y}Sn$ sintered body. In $0 \leq y \leq 0.05$, it was found that the sintered body contained a single phase of the half-Heusler phase, which was a target phase. On the other hand, in $0.05 < y$, diffraction peaks (represented by "▼" in FIGS. 10 and 11) resulting from (220) plane of the Heusler phase were found, besides the half-Heusler phase, a target phase. It was learned that the intensities of the peaks were increased with the increase in y. The existence ratio of the Heusler phase was calculated to be 3% in y=0.06, and 5.5% in y=0.10, from the ratio of the peak intensity. As such, there was seen a tendency in which the existence ratio of the Heusler phase was also increased with the increase in y.

Figure 12:
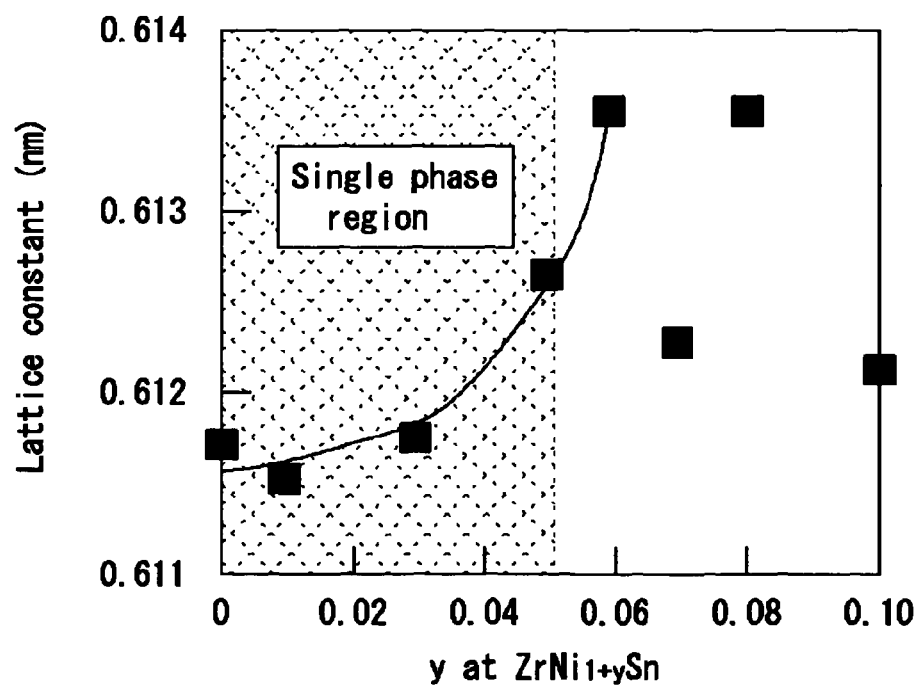
FIG. 12 is a graph illustrating the relationship between the y value (Ni/Sn ratio) and the lattice constant of the $ZrNi_{1+y}Sn$ sintered body.

The lattice constant was determined from the diffraction peaks of the half-Heusler phase. FIG. 12 shows the relation between the y value (Ni/Sn ratio) and the lattice constant of the $ZrNi_{1+y}Sn$ sintered body. In $0 \leq y < 0.06$, there was seen a tendency in which the lattice constant was increased within the range of 0.6110 nm to 0.6130 nm, with the increase in y. Considering that the sintered body contained a single phase of the half-Heusler phase and that the lattice constant was increased, it is estimated that, in $0 \leq y \leq 0.05$, Ni interstitial defects were generated in which excessive Ni occupied the vacant sites at random.

[3.2. Thermoelectric Property]

[3.2.1. Thermal Conductivity κ]

Figure 13:
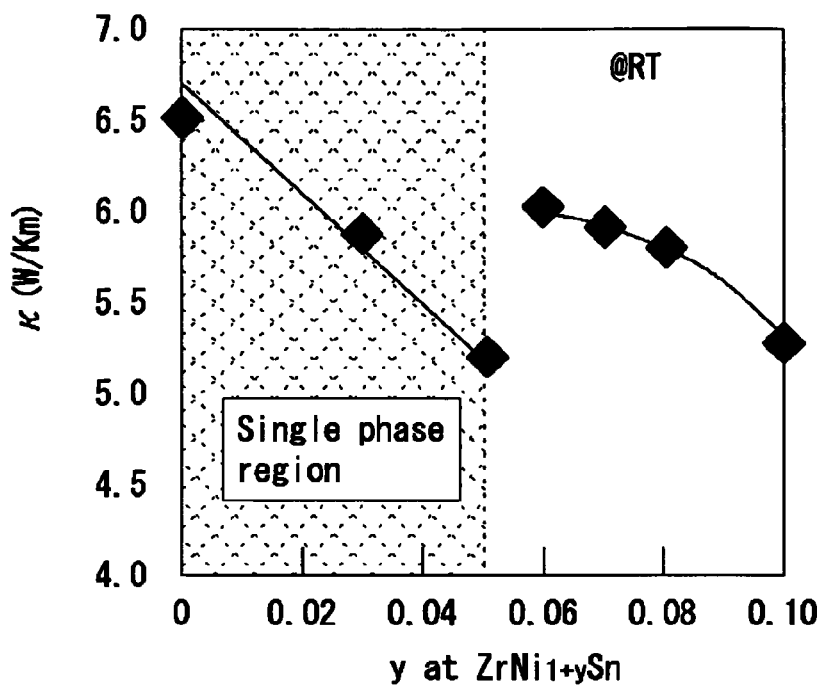
FIG. 13 is a graph illustrating the relationship between the y value (Ni/Sn ratio) and the thermal conductivity κ of the $ZrNi_{1+y}Sn$ sintered body.

The thermal conductivity of the $ZrNi_{1+y}Sn$ sintered body at room temperature was evaluated by the laser flash method. FIG. 13 shows the results. In the graph illustrating dependence of the thermal conductivity on y, discontinuity was found when y=0.05 or more. In the composition of $0 \leq y \leq 0.05$ where the lattice constant was increased depending on y and only the single phase was contained, the thermal conductivity was reduced with the increase in y. This is due to the increase in an amount of the Ni interstitial defects.

Meanwhile, in y=0.06, the thermal conductivity was once increased and when y was further increased, there was seen a tendency in which the thermal conductivity was reduced with the increase in y. It is considered that the discontinuity in the graph illustrating the thermal conductivity is generated due to the generation of the Heusler phase.

[3.2.2. Seebeck Coefficient, Electrical Conductivity and Power Factor]

Figure 14:
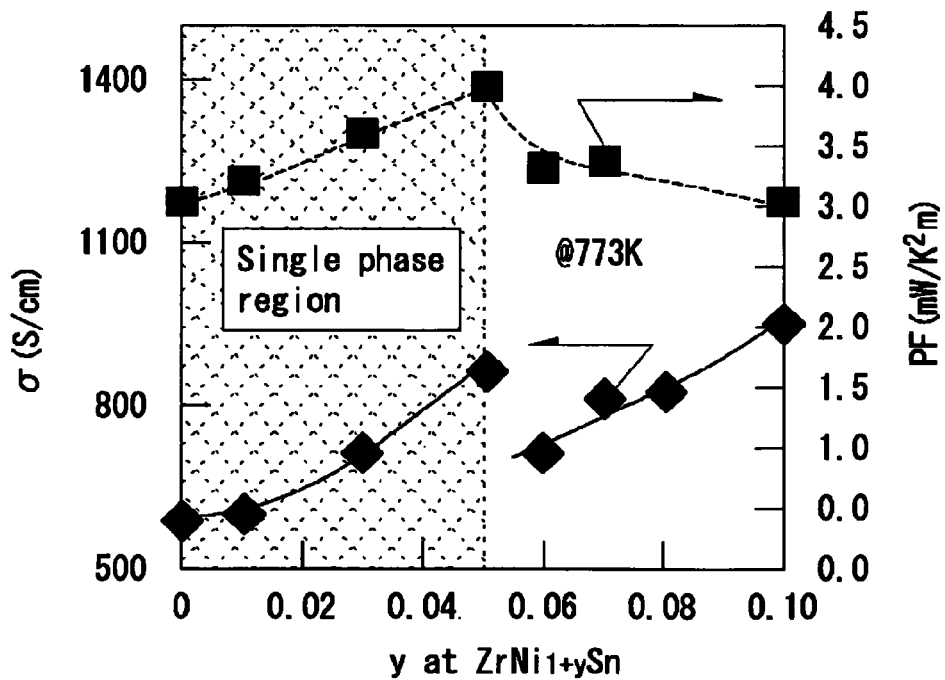
FIG. 14 is a graph illustrating the relationship between the y value (Ni/Sn ratio) and the electrical conductivity σ of the $ZrNi_{1+y}Sn$ sintered body.

The $ZrNi_{1+y}Sn$ sintered body was processed into a prism having a size of 3×3×10 mm, and its Seebeck coefficient and electrical conductivity were measured at 373 K to 973 K by using ZEM-III, so that its power factor was evaluated. FIG. 14 shows dependence of the electrical conductivity and the power factor on y at 773 K.

In the composition of $0 \leq y \leq 0.05$ where the lattice constant is increased depending on y and only the single phase was contained, the electrical conductivity was increased with the increase in y. This can be understood as the result that an impurity level was generated by the introduction of the Ni interstitial defects, thereby the carrier concentration being raised. Further, there was seen a tendency in which the electrical conductivity was once reduced when y=0.06 but the electrical conductivity was increased again when y was further increased. It can be understood that this discontinuity was generated due to the generation of the secondary phase.

The power factor also varied depending on the composition. In the composition of $0 \leq y \leq 3.05$ where the lattice constant was increased depending on y and only the single phase was contained, the power factor was increased with the increase in y.

[3.2.3. Pseudo Dimensionless Figure of Merit]

Figure 15:
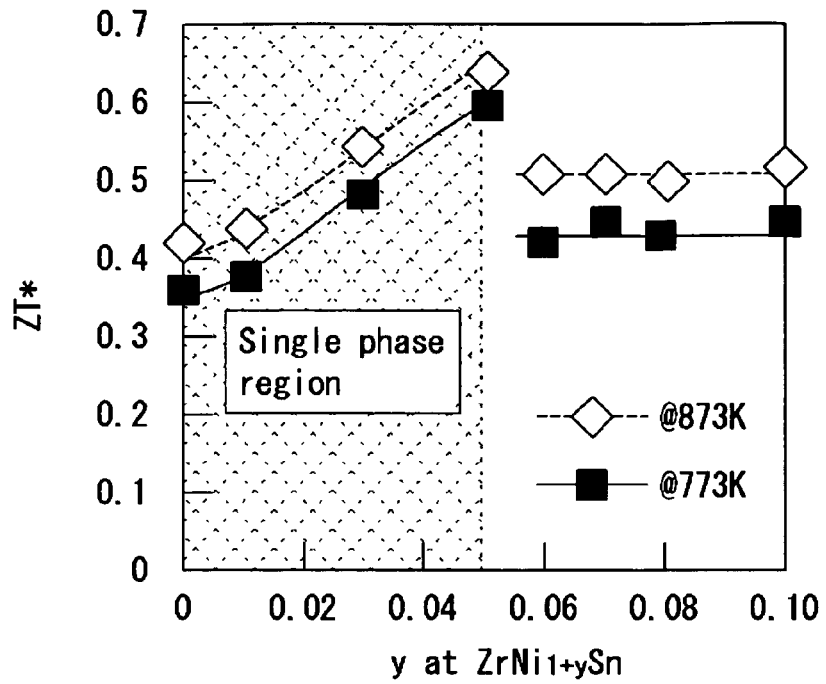
FIG. 15 is a graph illustrating the relationship between the y value (Ni/Sn ratio) and the dimensionless figure of merit ZT* of the $ZrNi_{1+y}Sn$ sintered body.

Assuming that the thermal conductivity at room temperature was maintained even at a high temperature, a pseudo dimensionless figure of merit ZT* was calculated from the following definition. FIG. 15 shows the results.

$$ZT^* = (PF_{@H.T.} / \kappa_{@R.T.}) \times T$$

where $PF_{@H.T.}$=power factor at a high temperature (773 K or 873 K) and $\kappa_{@R.T.}$=thermal conductivity at room temperature.

In the composition of $0 \leq y \leq 0.05$ where only the single phase was contained and the lattice constant was increased, there was seen a tendency in which the dimensionless figure of merit ZT* was increased with the increase in y. In the composition of $0.06 \leq y$, ZT* became an almost constant value with the decrease in the thermal conductivity and the decrease in the power factor canceling each other.

Example 12

[1. Production of Samples]

For the purpose of optimizing the carrier concentration, samples were produced in which the relevant sites of the $ZrNi_{1+y}Sn$ as a base material were simultaneously substituted with Y and Sb. That is, Y, Ni and Sb were weighed such that the whole composition of them became YNiSb, and then they were placed in a crucible made of boron nitride. They were melted with the use of high frequency induction heating to obtain a YNiSb ingot. The YNiSb thus produced as well as Zr, Ni and Sn were weighed such that the whole composition of them became $(Zr_{1-a}Y_a)Ni_{1+y}(Sn_{1-a}Sb_a)$ ($0 \leq a \leq 0.02$, $0 \leq y \leq 0.10$), and they were melted by high frequency induction heating with the use of the crucible made of boron nitride. Thereafter, by using the same procedures as in Example 11, a sintered body was produced.

[2. Test Method]

Electrical properties were evaluated according to the same procedures as in Example 11.

[3. Result]

Figure 16:
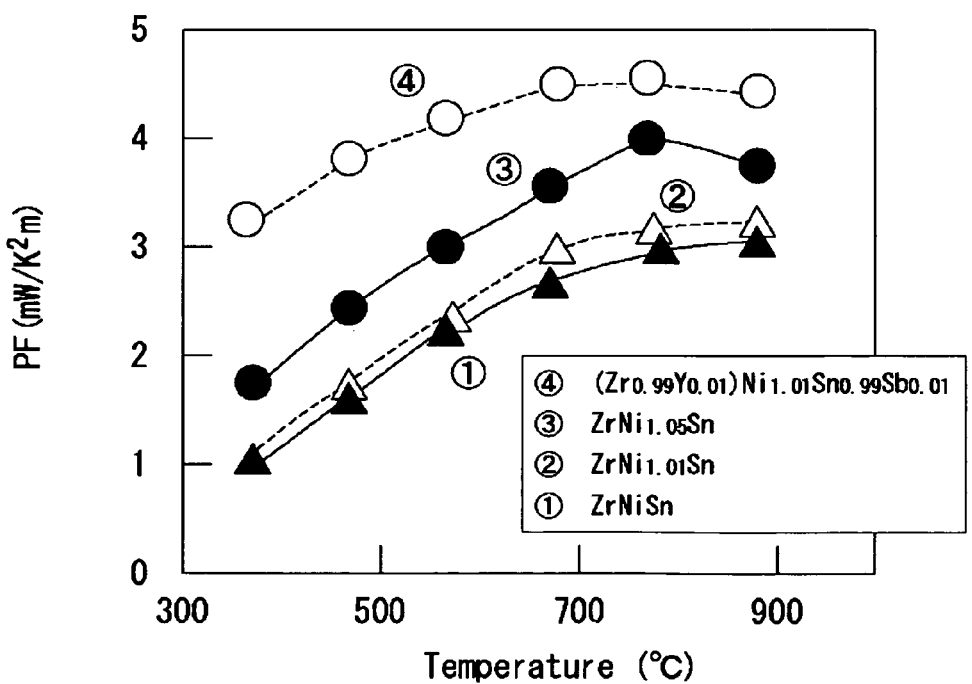
FIG. 16 is a graph illustrating the temperature dependence of the power factors PF of the $ZrNi_{1+y}Sn$ sintered body and the $(Zr_{0.99}Y_{0.01})Ni_{1.01}Sn_{0.99}Sb_{0.01}$ sintered body.

FIG. 16 shows the power factors of the $(Zr_{1-a}Y_a)Ni_{1+y}(Sn_{1-a}Sb_a)$ sintered body. In the figure, the results of the $ZrNi_{1+y}Sn$ sintered body are also shown. In the sample of a=0, the power factor increased with the increase in y (1→2→3 in FIG. 16). It can be appreciated that the carrier concentration was optimized by dissolving 1 mol % of YNiSb in the $ZrNi_{1.01}Sn$, thereby the power factor being improved by approximately 50% (2→4 in FIG. 16).

Figure 17:
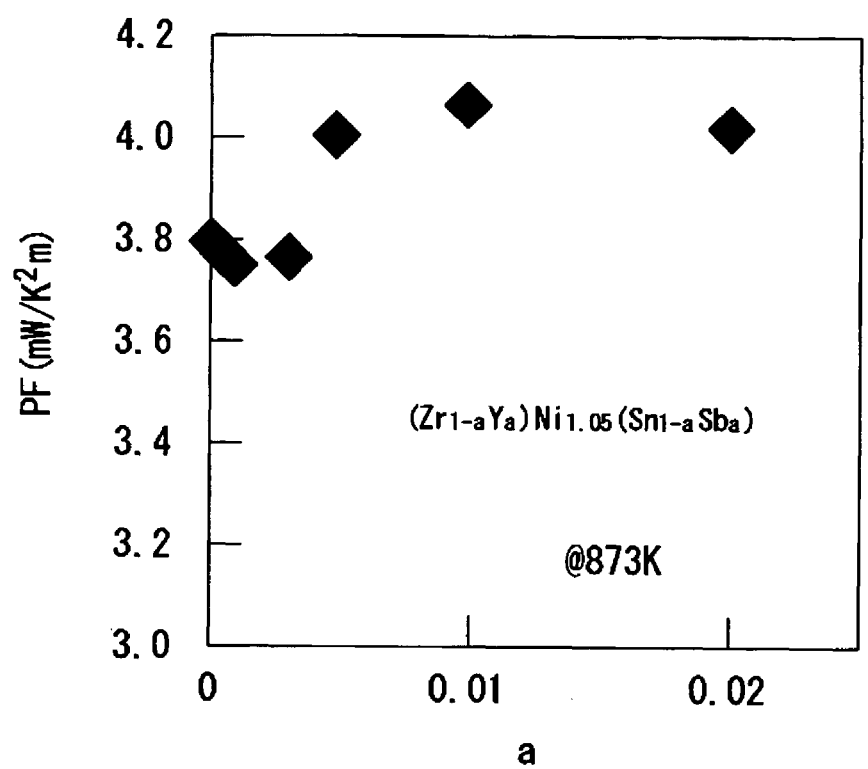
FIG. 17 is a graph illustrating the relationship between the a value and the power factor PF of the $(Zr_{1-a}Y_a)Ni_{1.05}(Sn_{1-a}Sb_a)$ sintered body.

FIG. 17 shows the relationship between the a value and the power factor of the $(Zr_{1-a}Y_a)Ni_{1+y}(Sn_{1-a}Sb_a)$ sintered body. When dissolving Y and Sb in the $ZrNi_{1.05}Sn$, the power factor was improved with the increase in the career concentration. It can be appreciated from FIG. 17 that the power factor becomes 4.0 mW/K²m or more when a is made equal to or more than 0.005 (0.5 mol %).

Embodiments of the present invention have been described in detail. However, the invention is not limited to the aforementioned embodiments, and various modifications may be made to the embodiments within the scope not departing from the gist of the invention.

[Industrial Applicability]

The thermoelectric material according to the present invention can be used as thermoelectric materials of which thermoelectric devices are composed, which are used in: various thermoelectric power generators such as solar thermoelectric generator, sea water temperature difference thermoelectric power generator, fossil fuel thermoelectric power generator, and regenerative power generator of factory exhaust heat and automotive exhaust heat; precision temperature control units such as photon-detection device, laser diode, field effect transistor, photo-multiplier, cell of spectrum photometer, and column of chromatography; and thermoelectric devices used in constant-temperature unit, air-conditioning and heating equipment, refrigerator, and power source of clocks, and the method of manufacturing the material can be used as a method of manufacturing the materials.

What is claimed is:

1. A thermoelectric material containing a half-Heusler compound comprising a composition represented by the following formula (1):

$$(Ti_{1-a}A_a)_{1+x}(Ni_{1-b}B_b)_{1+y}(Sn_{1-c}C_c) \quad (1)$$

where
$0 \leq a < 0.1$, $0 \leq b < 0.1$ and $0 \leq c < 0.1$;
$-0.1 \leq x \leq 0.2$ and $0 < y \leq 0.2$;
at least two or more of a, b, and c are not zero;
if a is not zero, A is one or more elements selected from the group consisting of Sc, Y, Zr, Hf, V, Nb, Ta, and rare earth elements (La to Lu);
if b is not zero, B is one or more elements selected from the group consisting of Fe, Co, Ru, Rh, Pd, Os, Ir, Pt, Cu, Ag, and Au; and
if c is not zero, C is one or more elements selected from the group consisting of B, Al, Ga, In, Tl, C, Si, Ge, Pb, N, P, As, Sb, and Bi,
wherein amounts of Zr substitution and Hf substitution at Ti sites of the half-Heusler compound are less than 1 at %, respectively.

2. The thermoelectric material according to claim 1, wherein y satisfies $0.015 \leq y \leq 0.145$.

3. The thermoelectric material according to claim 1, wherein a lattice constant of the half-Heusler compound (main phase) is within the range of 0.5933 nm to 0.5947 nm (inclusive).

4. The thermoelectric material according to claim 1, wherein a ratio of the maximum peak intensity (IFULL(220)×100/IHALF(220)) is less than 18%, where IHALF(220) is the maximum peak intensity in X-ray diffraction of the half-Heusler phase, and IFULL(220) is the maximum peak intensity in X-ray diffraction of the full-Heusler phase.

5. The thermoelectric material according to claim 1, wherein the A is Y,
B is one or more selected from Co and Cu, and
C is one or more selected from the group consisting of Al, Si and Sb.

6. The thermoelectric material according to claim 1, wherein a dimensionless figure of merit ZT is 0.05 or more at room temperature.

7. A method of manufacturing a thermoelectric material comprising:
obtaining a molten metal by melting a raw material weighed so as to become the half-Heusler compound according to claim 1, or by remelting an ingot produced by melting a raw material weighed so as to become the half-Heusler compound, then
casting the molten metal, and
rapidly cooling the molten metal, during which the molten metal is rapidly solidified.

8. The method of manufacturing a thermoelectric material according to claim 7, wherein a cooling rate in the rapid cooling step is 100° C./sec or more.

9. The method of manufacturing a thermoelectric material according to claim 7, further comprising a sintering step in which powder obtained in the rapid cooling step is sintered.

10. A thermoelectric material containing a half-Heusler compound comprising a composition represented by the following formula (2):

$$(Zr_{1-a}A_a)_{1+x}(Ni_{1-b}B_b)_{1+y}(Sn_{1-c}C_c) \quad (2)$$

where:
$0 \leq a < 0.1$, $0 \leq b < 0.1$ and $0 \leq c < 0.1$;
$-0.1 \leq x \leq 0.2$ and $0 < y \leq 0.2$;
at least two or more of a, b, and c are not zero;
if a is not zero, A is one or more elements selected from the group consisting of Sc, Y, Ti, Hf, V, Nb, Ta, and rare earth elements (La to Lu);
if b is not zero, B is one or more elements selected from the group consisting of Fe, Co, Ru, Rh, Pd, Os, Ir, Pt, Cu, Ag, and Au; and
if c is not zero, C is one or more elements selected from the group consisting of B, Al, Ga, In, Tl, C, Si, Ge, Pb, N, P, As, Sb, and Bi,
wherein an amount of Hf substitution at Zr sites of the half-Heusler compound is less than 1 at %.

11. The thermoelectric material according to claim 10, wherein y satisfies $0.01 \leq y \leq 0.10$.

12. The thermoelectric material according to claim 10, wherein a lattice constant of the half-Heusler compound (main phase) is within the range of 0.6110 nm to 0.6130 nm (inclusive).

13. The thermoelectric material according to claim 10, wherein a ratio of the maximum peak intensity (IFULL(220)×100/IHALF(220)) is less than 6%, where IHALF(220) is the maximum peak intensity in X-ray diffraction of the half-Heusler phase, and IFULL(220) is the maximum peak intensity in X-ray diffraction of the full-Heusler phase.

14. The thermoelectric material according to claim 10,
wherein A is one or more selected from the group consisting of Y, Sc, Nb, V, Ta, and rare earth elements,
B is one or more selected from the group consisting of Cu, Ag, Au, Pd, and Pt, and
C is one or more selected from the group consisting of Al, Si, and Sb.

15. A method of manufacturing a thermoelectric material comprising:
obtaining a molten metal by melting a raw material weighed so as to become the half-Heusler compound according to claim 10, or by remelting an ingot produced by melting a raw material weighed so as to become the half-Heusler compound, then
casting the molten metal, and
rapidly cooling the molten metal, during which the molten metal is rapidly solidified.

16. The method of manufacturing a thermoelectric material according to claim 15, wherein a cooling rate in the rapid cooling step is 100° C./sec or more.

17. The method of manufacturing a thermoelectric material according to claim 15, further comprising a sintering step in which powder obtained in the rapid cooling step is sintered.

* * * * *